(12) United States Patent
Barr et al.

(10) Patent No.: US 12,335,635 B1
(45) Date of Patent: Jun. 17, 2025

(54) HYBRID OMNIDIRECTIONAL CAMERA SYSTEMS

(71) Applicant: Amazon Technologies, Inc., Seattle, WA (US)

(72) Inventors: Jeffrey David Barr, Seattle, WA (US); Jean Laurent Guigues, Seattle, WA (US); Abhinav Kashyap, Redmond, WA (US); Sarah M. Langehennig, Seattle, WA (US); Michael Lim, Kirkland, WA (US); Shuai Yue, Bellevue, WA (US)

(73) Assignee: Amazon Technologies, Inc., Seattle, WA (US)

( * ) Notice: Subject to any disclaimer, the term of this patent is extended or adjusted under 35 U.S.C. 154(b) by 123 days.

(21) Appl. No.: 18/323,720

(22) Filed: May 25, 2023

(51) Int. Cl.
*H04N 23/90* (2023.01)
*G08B 13/196* (2006.01)
*H04N 23/51* (2023.01)
*H04N 23/52* (2023.01)
*H05K 7/20* (2006.01)

(52) U.S. Cl.
CPC ....... *H04N 23/90* (2023.01); *G08B 13/19619* (2013.01); *G08B 13/19641* (2013.01); *H04N 23/51* (2023.01); *H04N 23/52* (2023.01); *H05K 7/20154* (2013.01); *H05K 7/20172* (2013.01); *H05K 7/20409* (2013.01)

(58) Field of Classification Search
CPC ...... H04N 23/698; H04N 23/51; H04N 23/54; H04N 23/55; H04N 23/57; H04N 23/90; H04N 23/52; B64U 2101/30; B64U 20/87; G03B 15/006; G03B 17/561; H05K 7/20154; H05K 7/20172; H05K 7/20409; G08B 13/19619; G08B 13/19641

See application file for complete search history.

(56) References Cited

U.S. PATENT DOCUMENTS

| | | |
|---|---|---|
| 3,191,898 A | 6/1965 | Mccullough |
| 7,225,980 B2 | 6/2007 | Ku et al. |
| 7,949,568 B2 | 5/2011 | Fano et al. |
| 8,009,864 B2 | 8/2011 | Linaker et al. |
| 8,175,925 B1 | 5/2012 | Rouaix |

(Continued)

OTHER PUBLICATIONS

Abhaya Asthana et al., "An Indoor Wireless System for Personalized Shopping Assistance", Proceedings of IEEE Workshop on Mobile Computing Systems and Applications, 1994, pp. 69-74, Publisher: IEEE Computer Society Press.

(Continued)

*Primary Examiner* — Timothy J Henn
(74) *Attorney, Agent, or Firm* — Athorus, PLLC

(57) ABSTRACT

A camera system includes a housing and camera modules (e.g., digital cameras) that are aligned with fields of view that extend below the housing. The camera modules are provided about a perimeter of the housing and mounted to a bench within the housing. Two camera modules have axes of orientation extending below and away from a centroid of the camera system. Two camera modules have axes of orientation extending below and toward the centroid of the camera system. The housing includes inlets and outlets that enable air to flow past the camera modules and other components within the housing. Images captured by the camera modules of the camera system may be utilized for any purpose.

20 Claims, 14 Drawing Sheets

(56) References Cited

U.S. PATENT DOCUMENTS

| | | | |
|---|---|---|---|
| 8,189,855 | B2 | 5/2012 | Opalach et al. |
| 8,210,368 | B2 | 7/2012 | Schwartzkopf et al. |
| 8,423,431 | B1 | 4/2013 | Rouaix et al. |
| 8,630,924 | B2 | 1/2014 | Groenevelt et al. |
| 8,688,598 | B1 | 4/2014 | Shakes et al. |
| 8,896,671 | B2 | 11/2014 | Jayaram et al. |
| 8,947,527 | B1 | 2/2015 | Postovalov et al. |
| 9,036,001 | B2 * | 5/2015 | Chuang ................ H04N 23/698 348/335 |
| 9,473,747 | B2 | 10/2016 | Kobres et al. |
| 10,051,958 | B2 | 8/2018 | Andersson et al. |
| 10,282,720 | B1 | 5/2019 | Buibas et al. |
| 10,435,176 | B2 * | 10/2019 | McClure ................ G05D 1/102 |
| 10,530,973 | B2 | 1/2020 | DePaschoal |
| 10,574,902 | B2 * | 2/2020 | Ogata ..................... H04N 23/50 |
| 10,577,125 | B1 * | 3/2020 | Burtt ..................... B64U 10/13 |
| 10,656,502 | B1 | 5/2020 | Sandoval |
| 10,949,986 | B1 * | 3/2021 | Colmenares ......... A61B 90/361 |
| 11,012,601 | B1 * | 5/2021 | Yue ........................ H04N 23/57 |
| 11,079,064 | B1 | 8/2021 | Cifers et al. |
| 11,113,938 | B2 | 9/2021 | Siminoff |
| 11,453,513 | B2 * | 9/2022 | Thompson ............. B64U 20/87 |
| 11,662,727 | B2 * | 5/2023 | Fang ..................... G05D 1/0094 701/3 |
| 12,007,068 | B2 | 6/2024 | Yamafune ............... B63B 35/00 |
| 2003/0002712 | A1 | 1/2003 | Steenburgh et al. |
| 2004/0181467 | A1 | 9/2004 | Raiyani et al. |
| 2007/0014347 | A1 | 1/2007 | Prechtl et al. |
| 2007/0024743 | A1 | 2/2007 | Hida |
| 2008/0055087 | A1 | 3/2008 | Horii et al. |
| 2008/0077511 | A1 | 3/2008 | Zimmerman |
| 2008/0109114 | A1 | 5/2008 | Orita et al. |
| 2009/0121017 | A1 | 5/2009 | Cato et al. |
| 2009/0245573 | A1 | 10/2009 | Saptharishi et al. |
| 2011/0011936 | A1 | 1/2011 | Morandi et al. |
| 2012/0242837 | A1 | 9/2012 | Sasagawa et al. |
| 2012/0284132 | A1 | 11/2012 | Kim et al. |
| 2013/0076898 | A1 | 3/2013 | Philippe et al. |
| 2013/0253700 | A1 | 9/2013 | Carson et al. |
| 2014/0279294 | A1 | 9/2014 | Field-Darragh et al. |
| 2014/0362223 | A1 | 12/2014 | LaCroix et al. |
| 2015/0019391 | A1 | 1/2015 | Kumar et al. |
| 2015/0073907 | A1 | 3/2015 | Purves et al. |
| 2015/0162048 | A1 * | 6/2015 | Hirata ............... G11B 20/10527 386/341 |
| 2017/0041535 | A1 * | 2/2017 | Nguyen ................. G06V 20/52 |
| 2017/0139309 | A1 * | 5/2017 | Axelsson ............. G03B 17/561 |
| 2017/0178352 | A1 | 6/2017 | Harmsen et al. |
| 2017/0313441 | A1 * | 11/2017 | Tsai ........................ B64U 10/13 |
| 2018/0070003 | A1 * | 3/2018 | Ramseyer .............. H04N 23/90 |
| 2018/0130255 | A1 | 5/2018 | Hazeghi et al. |
| 2018/0332236 | A1 | 11/2018 | Glaser et al. |
| 2018/0356710 | A1 | 12/2018 | Bingleman et al. |
| 2019/0002124 | A1 * | 1/2019 | Garvin .................... B64D 47/08 |
| 2019/0028054 | A1 | 1/2019 | Karkheck |
| 2019/0066335 | A1 * | 2/2019 | Dahlström ........... H04N 17/002 |
| 2019/0081587 | A1 | 3/2019 | Mayfield et al. |
| 2019/0191059 | A1 * | 6/2019 | Park ....................... H04N 23/90 |
| 2019/0191083 | A1 * | 6/2019 | Gorloff .................. H04N 23/90 |
| 2019/0278078 | A1 | 9/2019 | Krishnan et al. |
| 2020/0084416 | A1 | 3/2020 | Noshita |
| 2020/0201144 | A1 | 6/2020 | Ramones et al. |
| 2020/0391864 | A1 * | 12/2020 | Lee ......................... B64U 20/87 |
| 2021/0072486 | A1 * | 3/2021 | Li ........................... G02B 7/021 |
| 2021/0396350 | A1 | 12/2021 | Eichinger et al. |
| 2022/0303445 | A1 | 9/2022 | Skaff et al. |

OTHER PUBLICATIONS

Cristian Pop, "Introduction to the BodyCom Technology", Microchip AN1391, May 2, 2011, pp. 1-24, vol. AN1391, No. DS01391A, Publisher: 2011 Microchip Technology Inc.

* cited by examiner

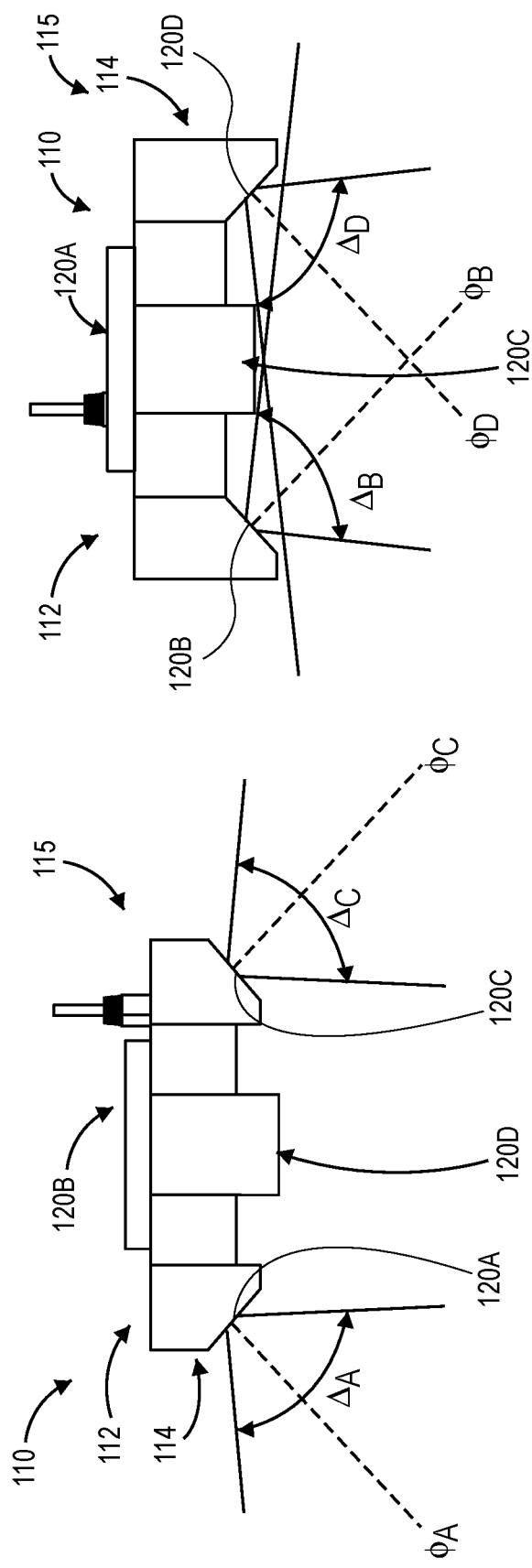

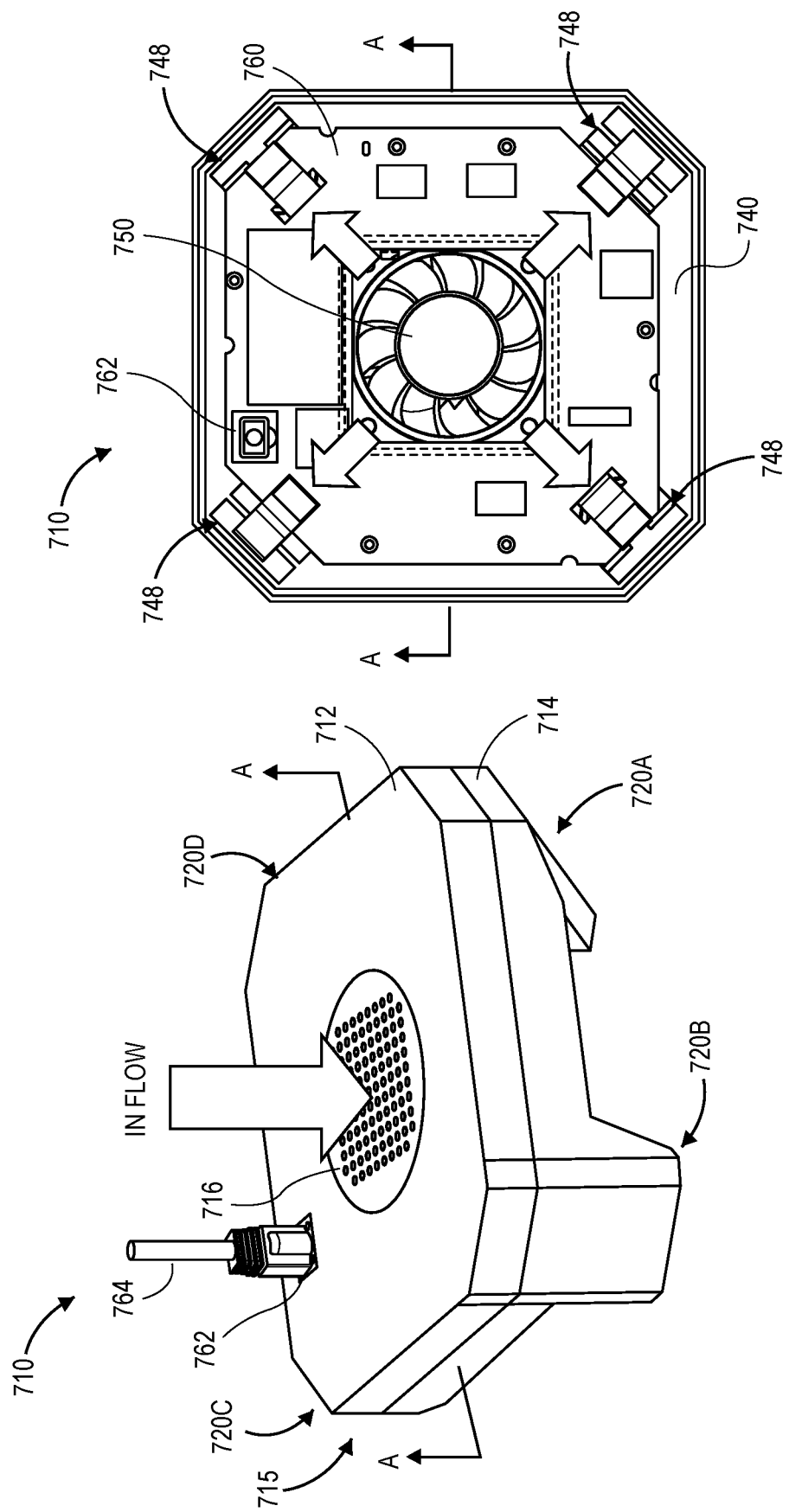

HYBRID OMNIDIRECTIONAL CAMERA SYSTEMS

BACKGROUND

Imaging devices, such as digital cameras, are frequently used in bricks-and-mortar commercial settings. In a materials handling facility, such as a retail store or establishment, a digital camera may be provided in one or more locations and configured to include portions of the materials handling facility within its field of view. Images captured by the digital camera may be processed to identify one or more customers or other personnel within the materials handling facility, to detect movements of such customers or personnel, or to identify items that are removed from storage units by such customers or personnel, or placed on such storage units by such customers or personnel.

Imaging devices that are provided within a materials handling facility are commonly mounted in elevated configurations, e.g., on ceilings or walls, in order to ensure that the fields of view of the imaging devices include accessible floor spaces, storage units or other areas. Mounting imaging devices on ceiling or walls, however, typically requires individual mounts and power and/or network connections for each of the imaging devices. Furthermore, because fields of view of imaging devices are centered about their respective axes of orientation, and defined as functions of their respective focal lengths, locations at which the imaging devices are mounted must be selected in order to ensure that specific areas of the materials handling facility are appropriately covered. Moreover, like all electronic or computer-driven components, imaging devices that are mounted in elevated configurations must be maintained at temperatures within acceptable bands or ranges, in order to ensure that the imaging devices operate properly, or in an optimal manner.

BRIEF DESCRIPTION OF THE DRAWINGS

FIGS. 1A through 1D are views of aspects of one camera system in accordance with implementations of the present disclosure.

FIGS. 7A through 7D are views of aspects of one camera system in accordance with implementations of the present disclosure.

DETAILED DESCRIPTION

As is set forth in greater detail below, the present disclosure is directed to omnidirectional camera systems that include multiple cameras, camera modules or other imaging devices, e.g., multi-camera systems. More specifically, the present disclosure is directed to systems including pairs of cameras or camera modules that are mounted within housings and feature axes of orientation or fields of view that are aligned both inwardly and outwardly with respect to yaw axes or centroids of the housings. The systems may be configured for mounting to ceilings or other elevated locations within retail establishments or other materials handling facilities. Imaging data may be captured from around a perimeter of the camera systems, and utilized for any purpose.

Housings of camera systems of the present disclosure may have architectures of any shapes or sizes. In some implementations, housings or other components of camera systems may have cylindrical shapes, or feature substantially round cross-sections, with cameras or camera modules distributed around perimeters of the housings. In some implementations, housings or other components of camera systems may feature substantially square cross-sections, with cameras or camera modules disposed at tapered corners of the cross-sections.

The camera systems of the present disclosure may feature pairs of cameras or camera modules that are mounted and aligned to capture imaging data from around perimeters of the cameras systems. One pair of the cameras or camera modules of a camera system may have axes of orientation and fields of view that are aligned below housings at predetermined angles, and radially away from yaw axes or centroids of such housings. Another pair of the cameras or camera modules of the camera system may have axes of orientation and fields of view that are also aligned below such housings but toward yaw axes or centroids of such housings. The camera systems may be mounted within spaces, such as materials handling facilities, in locations and orientations that are selected to exploit the architectures of the camera systems and to facilitate the capture of imaging data from such spaces.

In some implementations, housings of camera systems of the present disclosure may include internal components for receiving power and forming network connections with external systems, as well as fans (e.g., axial fans) or blowers for circulating cooling air flow through the housings to remove heat generated by the camera modules during operations.

Figure 1A:
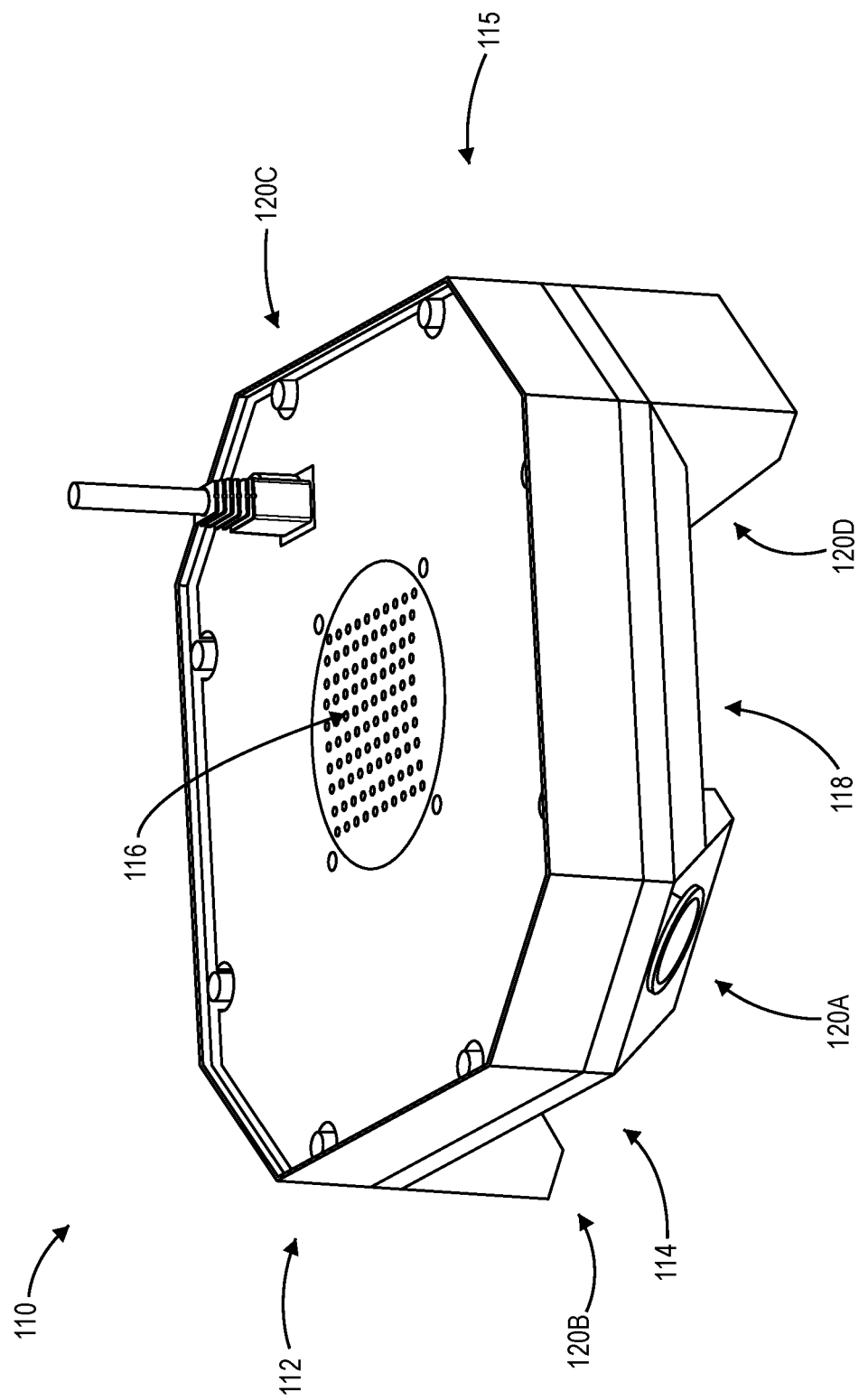
Figure 1B:
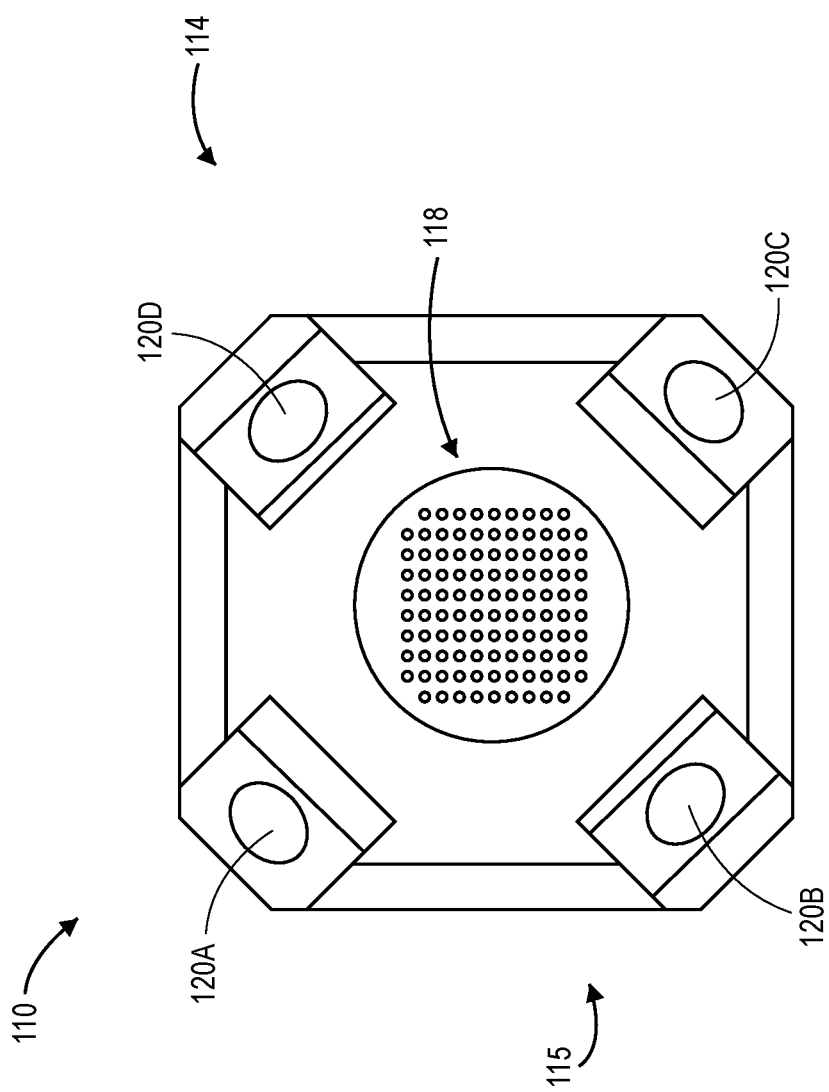

Referring to FIGS. 1A through 1D, views of aspects of one system including a camera system 110 in accordance with implementations of the present disclosure are shown. As is shown in FIGS. 1A and 1B, a camera system 110 includes two pairs of camera modules 120A, 120B, 120C, 120D that are provided within a housing 115 or other structure formed from one or more parts, e.g., an upper frame (or cover assembly) 112 and a lower frame (or cover assembly) 114, and have fields of view that extend normal from angled surfaces provided at least in part below the camera system 110. Each of the camera modules 120A, 120B, 120C, 120D may be configured to capture color images, grayscale images, black-and-white images, or any other type or form of imaging data (e.g., depth images). The camera system 110 may be configured for mounting to a ceiling or another elevated surface or fixture within a materials handling facility, or any other facility located in any environment or scene.

In some implementations, the camera modules 120A, 120B, 120C, 120D may include one or more sensors that are configured to capture visual imaging data at relatively high levels of resolution, e.g., eight to sixteen megapixels per image, and at relatively high frame rates, e.g., fifteen or more frames per second (fps). Such sensors may include arrays of photodetectors or photosensitive components such as charge coupled devices ("CCD"), complementary metal-oxide sensors ("CMOS"), photodiodes, or the like. The sensors may capture light reflected from objects and assign one or more quantitative values (e.g., red, green, blue or other color values, or distances or ranges to such objects) to aspects of the reflected light. Alternatively, or additionally, in some implementations, the camera modules 120A, 120B, 120C, 120D may be configured to capture any other imaging data, such as depth imaging data, or visual imaging data at any levels of resolution or frame rates.

As is shown in FIG. 1B, each of the camera modules 120A, 120B, 120C, 120D is evenly distributed about a yaw axis or centroid of the housing 115, such that the respective camera modules 120A, 120B, 120C, 120D are separated by ninety degrees from one another about the yaw axis or centroid. As is further shown in FIG. 1B, the camera module 120A and the camera module 120C are aligned directly opposite one another, and the camera module 120B and the camera module 120D are aligned directly opposite one another. Alternatively, or additionally, the camera modules 120A, 120B, 120C, 120D need not be evenly distributed about the yaw axis or centroid, and may instead be unevenly distributed about the yaw axis or centroid, such that one pair of the camera modules 120A, 120B, 120C, 120D is separated by greater than ninety degrees about the yaw axis or centroid, and another pair of the camera modules is separated by less than ninety degrees about the yaw axis or centroid.

Although FIG. 1B shows only the four camera modules 120A, 120B, 120C, 120D, camera systems of the present disclosure may include or feature any number of camera modules, e.g., greater than or less than four of such modules, and any number of such camera modules may face away from or toward one another, at any angles. Moreover, such camera modules may be evenly distributed throughout a perimeter of the housing, in a manner similar to the four camera modules 120A, 120B, 120C, 120D of FIG. 1B, or distributed unevenly.

As is shown in FIGS. 1A and 1B, the upper frame 112 of the housing 115 includes an air flow inlet 116, and the lower frame 114 of the housing 115 includes an air flow outlet 118. The upper frame 112 may be configured for mounting the camera system 110 to one or more surfaces, e.g., ceilings, false ceilings (such as to poles, frames, panels or joints), trusses, beams, walls, shelves, arches, bridges, stanchions or other systems, either directly or to one or more other components (e.g., a tie rod) extending therefrom, that are provided above or in association with a retail establishment or another materials handling facility.

The upper frame 112 or the lower frame 114 may form or define a cavity within the housing 115 for accommodating the camera modules 120A, 120B, 120C, 120D, circuit boards, benches (e.g., optical benches) or other components therein. One or more of the upper frame 112 or the lower frame 114 may act as a chassis to provide structural support for the camera modules 120A, 120B, 120C, 120D installed therein, as well as any number of circuit boards, optical benches or other systems or components for mounting or supporting the camera modules 120A, 120B, 120C, 120D, or for enabling the camera modules 120A, 120B, 120C, 120D to capture and process imaging data, or transmit the imaging data to one or more external devices or systems (not shown). Likewise, one or more of the upper frame 112 or the lower frame 114 may act as a cover, a case, a shroud or another system that is configured to mate with such a chassis, and to enclose the camera modules 120A, 120B, 120C, 120D, circuit boards, optical benches or other systems or components therein.

The upper frame 112 and the lower frame 114 may be formed in any manner, such as by injection molding, and from any suitable materials. For example, in some implementations, the upper frame 112 or the lower frame 114 may be formed from polycarbonates or combinations of polycarbonates and other materials, such as acrylonitrile butadiene styrene (or "ABS"). Alternatively, in some other implementations, the upper frame 112 or the lower frame 114 may be formed from any materials other than plastics or composites, including but not limited to woods or metals. Furthermore, in some implementations, the upper frame 112 and the lower frame 114 may be combined in a single-piece construction, or may be coupled or joined by one or more hinges. Alternatively, in some other implementations, a camera system of the present disclosure need not include the housing 115. In such implementations, one or more components of the camera system 110, such as circuit boards, optical benches, camera modules or heat sinks, may be joined to a ceiling or other surface to mount the camera system 110 in a desired orientation or configuration.

The housing 115 or the upper frame 112 and the lower frame 114 may have any dimensions or shapes, which may be selected based on a desired size of a chassis for the components of the camera system 110, or a desired size of a cavity to be defined by the upper frame 112 and the lower frame 114, based on any operational or mounting requirements, or on any other basis. For example, as is shown in FIGS. 1A and 1B, the housing 115 has a substantially square shape or cross-section with tapered corners, with respect to a yaw axis or a vertical axis of the camera system 110, or a substantially octagonal shape or cross-section having opposing pairs of long sides and short sides. In some other implementations, the camera system 110 may have a substantially cylindrical shape or a circular cross-section, with respect to a yaw axis or a vertical axis of the camera system 110.

In some implementations, the housing 115 may have a length, a width or a diameter of approximately one hundred ninety millimeters (mm). In some implementations, the housing 115 may have a height of approximately seventy millimeters (mm).

Alternatively, the upper frame 112 and the lower frame 114, or cross-sections defined therefrom, may have any other shapes with respect to a yaw axis or centroid of the housing, as well as lengths and widths of any dimension.

As is further shown in FIGS. 1A and 1B, the lower frame 114 includes surfaces or panels that descend below a perimeter of the upper frame 112 and are provided at slopes or angles with respect to an underside of the housing 115. As is shown in FIG. 1B, lenses 128A, 128B, 128C, 128D of the camera modules 120A, 120B, 120C, 120D extend through openings in the lower frame 114, and are aligned with axes of orientation that extend normal to and away from the angled surfaces or panels of the lower frame 114. The lower frame 114 may be configured for mating the upper frame 112 by any number of fasteners or other systems, either independently or with one or more other components, e.g., gaskets. In some implementations (not shown in FIGS. 1A through 1D), the lenses 128A, 128B, 128C, 128D may be covered by entirely or partially transparent or translucent windows or shields.

The slopes or angles of the surfaces or panels descending below the perimeter of the upper frame 112 may be selected on any basis, such as a desired axis of orientation of the camera modules or lenses 128A, 128B, 128C, 128D provided therein and extending normal therefrom, or a desired coverage of the fields of view extending from the lenses 128A, 128B, 128C, 128D.

As is shown in FIG. 1A, the housing 115 further includes the inlet 116, which is provided on a top surface or panel of the upper frame 112 and aligned to receive air vertically from above the camera system 110 into the housing 115. The housing 115 may further include any number of holes, ports or openings (not shown) for mounting the camera system 110 to ceilings or one or more other elevated surfaces.

As is shown in FIG. 1B, the housing 115 further includes the outlet 118, which is provided on an underside of the lower frame 114, and is aligned to expel flows of air in a substantially vertical direction below the housing 115, thereby discharging heat from within the camera system 110 to ambient. Where the camera system 110 includes a fan (e.g., an axial fan) or a blower, the camera system 110 may draw air at ambient temperatures into the housing 115, and direct air across or near one or more components within the camera system 110, e.g., any circuit boards, optical benches or the camera modules 120A, 120B, 120C, 120D before expelling the air from the camera system 110 in a substantially vertical direction, by way of the outlet 118. For example, the housing 115 may define an internal flow path between the inlet 116 and the outlet 118 that passes over or through any number of ducts or spaces between fins, pins or other features, as well as any channels, openings, circuit boards, optical benches and the camera modules 120A, 120B, 120C, 120D.

As is shown in FIGS. 1C and 1D, the camera modules 120A, 120B, 120C, 120D are aligned with axes of orientation and fields of view that are provided at non-parallel angles and extend below the housing 115. The camera modules 120A, 120C, are "outward facing," or face away from each other, and away from a yaw axis or a centroid of the camera system 110. The camera modules 120B, 120D are "inward facing," or face toward one another, and toward a yaw axis or a centroid of the camera system 110.

For example, as is shown in FIG. 1C, the camera module 120A has an axis of orientation $\phi_A$ and a field of view $\Delta_A$ that extend vertically downward from an extension to which the camera module 120A is mounted and radially away from a yaw axis or a centroid of the camera system 110. The camera module 120C has an axis of orientation $\phi_C$ and a field of view $\Delta_C$ that extend vertically downward from an extension to which the camera module 120C is mounted and radially away from a yaw axis or a centroid of the camera system 110. As is further shown in FIG. 1C, the axis of orientation $\phi_A$ and the field of view $\Delta_A$ of the camera module 120A extend in a direction that is radially opposite from a direction of the axis of orientation $\phi_C$ and the field of view $\Delta_C$ of the camera module 120C, such that the fields of view $\Delta_A$, $\Delta_C$ do not overlap.

As is shown in FIG. 1D, the camera module 120B has an axis of orientation $\phi_B$ and a field of view $\Delta_B$ that extend vertically downward from an extension to which the camera module 120B is mounted and radially inward toward a yaw axis or a centroid of the camera system 110. The camera module 120D has an axis of orientation $\phi_D$ and a field of view $\Delta_D$ that extend vertically downward from an extension to which the camera module 120D is mounted and radially inward toward the yaw axis or the centroid of the camera system 110. As is further shown in FIG. 1D, the axis of orientation ØB and the field of view $\Delta_B$ of the camera module 120B extend in a direction that is radially inward toward a direction of the axis of orientation $\phi_D$ and the field of view $\Delta_D$ of the camera module 120C, such that the fields of view $\Delta_B$, $\Delta_D$ overlap beneath the camera system 110.

The camera modules 120A, 120B, 120C, 120D may be utilized and configured to capture images in any environment, such as in a materials handling facility, as actors execute one or more interactions with shelving units or other systems, e.g., by removing items from such shelving units or other systems, or placing items onto such shelving units or other systems, or taking any other actions. Such systems may include but need not be limited to aisles, rows, bays, slots, bins, racks, tiers, bars, hooks, cubbies or other like systems, or any other appropriate regions or stations, which may be flat or angled, stationary or mobile, and of any shape or size.

In some implementations, each of the camera modules 120A, 120B, 120C, 120D may have a common or similar level of resolution. In some other implementations, however, each of the camera modules 120A, 120B, 120C, 120D may have different levels of resolution. For example, where one pair of the camera modules 120A, 120B, 120C, 120D is intended for use primarily in product identification, that pair of camera modules 120A, 120B, 120C, 120D may have one level of resolution. Where another pair of the camera modules 120A, 120B, 120C, 120D is intended for use primarily in locating or tracking personnel, however, that pair of the camera modules 120A, 120B, 120C, 120D may have another level of resolution, which may be greater or less than the level of resolution of the pair of camera modules 120A, 120B, 120C, 120D that is primarily used for product identification.

Similarly, the axes of orientation $\phi_A$, $\phi_B$, $\phi_C$, $\phi_D$ may extend downward at any angles from the extensions to which the camera modules 120A, 120B, 120C, 120D are mounted. In some implementations, the axes of orientation $\phi_A$, $\phi_B$, $\phi_C$, $\phi_D$ may extend at angles of approximately forty degrees below a plane defined by the housing 115, e.g., a horizontal plane, or any other plane. Likewise, the fields of view $\Delta_A$, $\Delta_B$, $\Delta_C$, $\Delta_D$ of the camera modules 120A, 120B, 120C, 120D may have any shape or dimensions. In some implementations, the fields of view $\Delta_A$, $\Delta_B$, $\Delta_C$, $\Delta_D$ may, in the aggregate, include an entire perimeter or circumference around the camera system 110. In some implementations, the fields of view $\Delta_A$, $\Delta_B$, $\Delta_C$, $\Delta_D$ may have dimensions of approximately one hundred seventy degrees by approximately one hundred seventy degrees. Alternatively, the fields of view may have any other dimensions.

The camera system 110 may be in communication with one or more external devices or systems, e.g., by one or more network connections (not shown). Additionally, in some implementations, the camera system 110 may be self-powered, e.g., by one or more internal or onboard power sources, such as batteries or fuel cells. In some other implementations, however, the camera system 110 may receive alternating current (or AC) or direct current (or DC) power from one or more external power sources, e.g., by one or more conductors or other connectors. For example, the camera system 110 may receive power by a dedicated connection to such sources, e.g., according to a Power over Ethernet (or "PoE") standard or system that may also be utilized to transfer information or data to or from the camera system 110.

Images captured by the camera modules 120A, 120B, 120C, 120D may be utilized for any purpose. For example, such images may be provided to a server or another computer device or system over one or more networks, which may include the Internet in whole or in part. In some implementations, servers or other devices or systems may process such images to generate trajectories representing locations, movements or orientations of any actors depicted therein. Alternatively, or additionally, servers or other devices or systems may further receive any other information or data captured by one or more other sensors (not shown), including but not limited to LIDAR sensors, RFID sensors, load sensors, or any other type or form of sensors, which may capture information or data and also provide the information or data to such servers or other devices or systems over one or more networks.

Accordingly, the camera systems of the present disclosure may be provided in any environment or scene, such as a retail establishment or another materials handling facility, and aligned to capture imaging data occurring at such environments or scenes. The camera systems may be mounted above such environments or scenes, such as to ceilings, false ceilings (e.g., to poles, frames, panels or joints), trusses, beams, or other systems. For example, one or more of the camera systems may be mounted directly to such systems, to one or more threaded tie rods or other components descending from such systems, or in any other manner. Alternatively, in some implementations, the camera systems of the present disclosure may be mounted to an underside of a structure, such as a shelf, an arch or a bridge, or to an elevated system such as a pole or stanchion. In still other implementations, the camera systems may be mounted to walls or other vertical surfaces in alignments such that axes of orientation of the camera modules extend within horizontal planes, or planes that are aligned at angles other than vertical.

Reflected light may be captured or detected by an imaging device if the reflected light is within the imaging device's field of view, which is defined as a function of a distance between a sensor and a lens within the imaging device, viz., a focal length, as well as a location of the imaging device and an angular orientation of the imaging device's lens. Accordingly, where an object appears within a depth of field, or a distance within the field of view where the clarity and focus is sufficiently sharp, an imaging device may capture light that is reflected off objects of any kind to a sufficiently high degree of resolution using one or more sensors thereof, and store information regarding the reflected light in one or more data files.

Many imaging devices also include manual or automatic features for modifying their respective fields of view or orientations. For example, an imaging device may be configured in a fixed position, or with a fixed focal length (e.g., fixed-focus lenses) or angular orientation. Alternatively, a imaging device may include one or more actuated or motorized features for adjusting a position of the imaging device, or for adjusting either the focal length (e.g., zooming the imaging device) or the angular orientation (e.g., the roll angle, the pitch angle or the yaw angle) of the imaging device, by causing a change in a distance between the sensor and the lens (e.g., optical zoom lenses or digital zoom lenses), a change in a location of the imaging device, or a change in one or more of the angles defining an angular orientation.

Figure 2A:
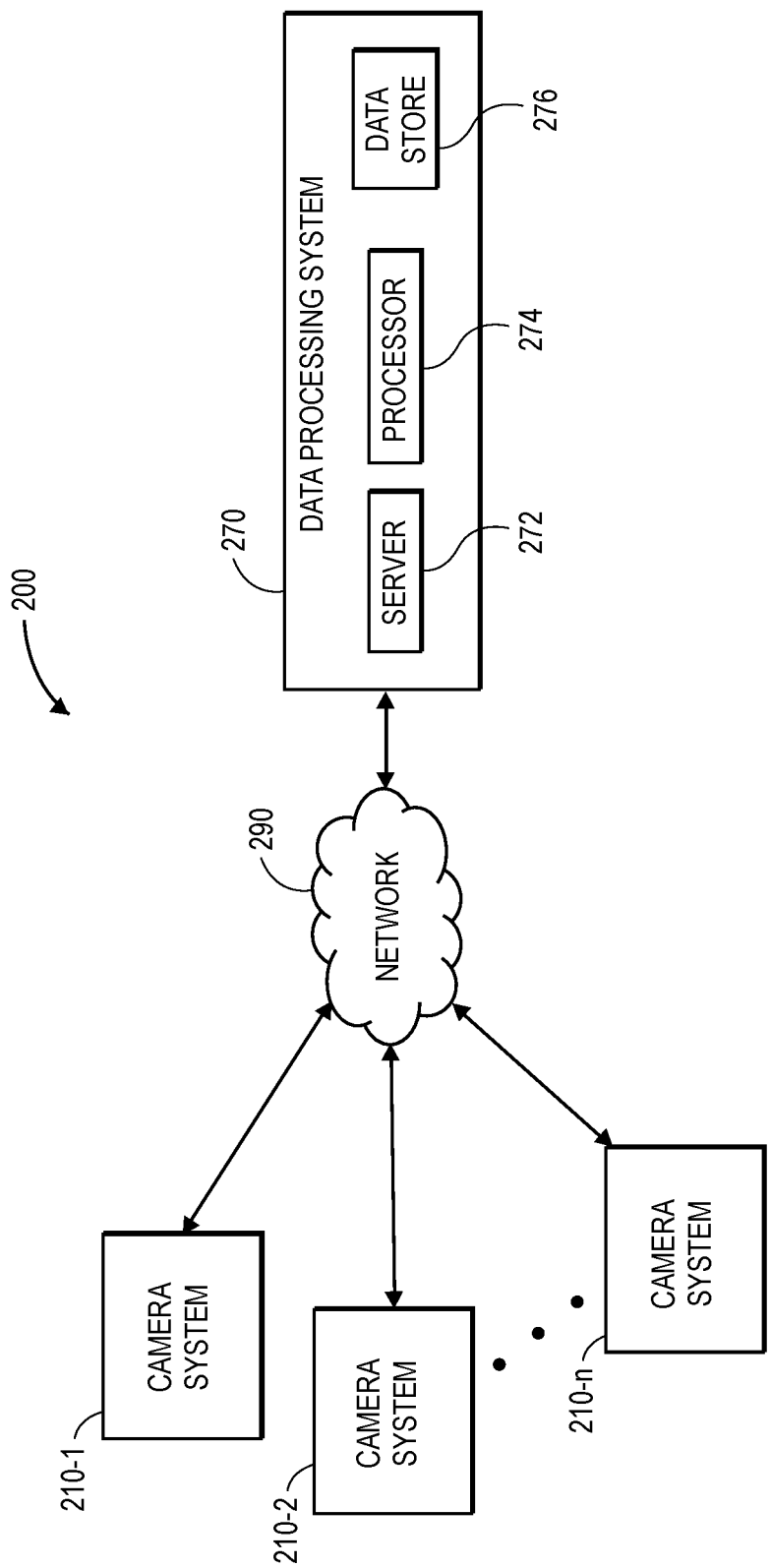
FIGS. 2A and 2B are block diagrams of one system including a camera system in accordance with implementations of the present disclosure.
Figure 2B:
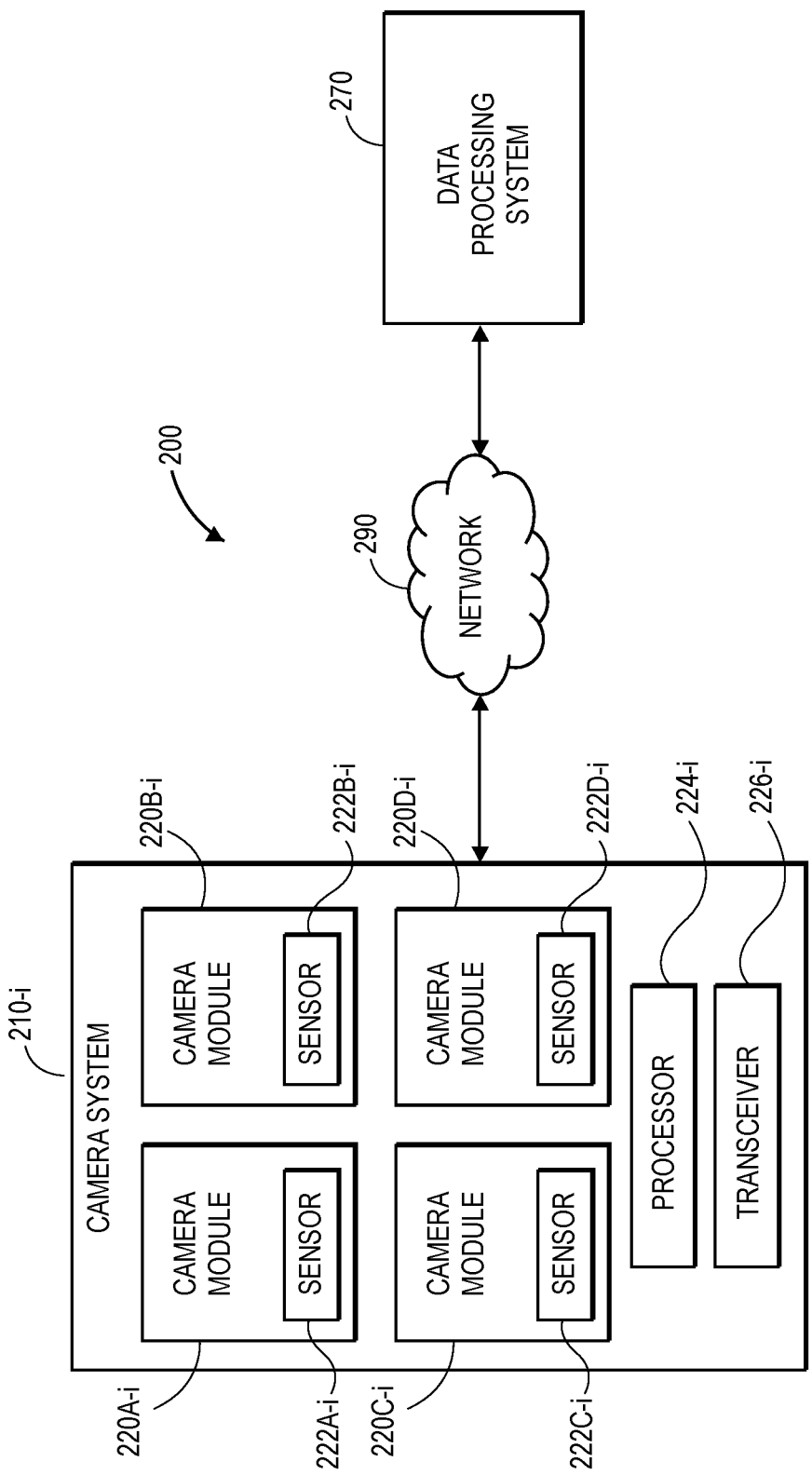

Referring to FIGS. 2A and 2B, block diagrams of one system including a camera system in accordance with implementations of the present disclosure are shown. Except where otherwise noted, reference numerals preceded by the number "2" shown in FIGS. 2A and 2B indicate components or features that are similar to components or features having reference numerals preceded by the number "1" shown in FIGS. 1A through 1D.

The system 200 of FIGS. 2A and 2B includes a plurality of camera systems 210-1, 210-2 . . . 210-$n$ and a data processing system 270 that are connected to one another over a network 290, which may include the Internet, in whole or in part. As is shown in FIG. 2B, a representative one of the camera systems 210-$i$ includes a plurality of camera modules 220A-$i$, 220B-$i$, 220C-$i$, 220D-$i$, each having one or more sensors 222A-$i$, 222B-$i$, 222C-$i$, 222D-$i$, as well as one or more processors 224-$i$ and one or more transceivers 226-$i$ or other communications systems.

The camera systems 210-1, 210-2 . . . 210-$n$ of the present disclosure may be any devices or systems that are configured for mounting to one or more elevated surfaces above an environment or scene, such as a retail establishment or another materials handling facility, and for capturing imaging data regarding events occurring within the environment or scene. The camera systems 210-1, 210-2 . . . 210-$n$ of the present disclosure may include multiple camera modules, viz., the camera modules 220A-$i$, 220B-$i$, 220C-$i$, 220D-$i$, that are mounted within housings and feature axes of orientation and fields of view that extend normal to angled sections or panels beneath the housings, downward and radially inward or outward from yaw axes or centroids of the camera systems 210-1, 210-2 . . . 210-$n$.

The camera modules 220A-$i$, 220B-$i$, 220C-$i$, 220D-$i$ may be any form of optical recording devices that may be used to capture, photograph or otherwise record imaging data of structures, facilities, terrain or any other elements appearing within their respective fields of view. The sensors 222A-$i$, 222B-$i$, 222C-$i$, 222D-$i$ may be any sensors, such as color sensors, grayscale sensors, black-and-white sensors, or other visual sensors, as well as depth sensors or any other type of sensors, that are configured to capture visual imaging data (e.g., textures) or depth imaging data (e.g., ranges) to objects within one or more fields of view of the camera modules 220A-$i$, 220B-$i$, 220C-$i$, 220D-$i$. In some implementations, the sensors 222A-$i$, 222B-$i$, 222C-$i$, 222D-$i$ may have single elements or a plurality of photoreceptors or photosensitive components (e.g., a CCD sensor, a CMOS sensor, or another sensor), which may be typically arranged in an array. Light reflected from objects within fields of view of the camera modules 220A-$i$, 220B-$i$, 220C-$i$, 220D-$i$ may be captured by the sensors 222A-$i$, 222B-$i$, 222C-$i$, 222D-$i$, and quantitative values, e.g., pixels, may be assigned to one or more aspects of the reflected light.

In addition to the one or more sensors 222A-$i$, 222B-$i$, 222C-$i$, 222D-$i$, the processors 224-$i$ and the transceiver 226-$i$, the camera modules 220A-$i$, 220B-$i$, 220C-$i$, 220D-$i$ may also include any number of other components that may be required in order to capture, analyze and/or store imaging data, including but not limited to one or more lenses, memory or storage components, photosensitive surfaces, filters, chips, electrodes, clocks, boards, timers, power sources, connectors or any other relevant features (not shown). Additionally, in some implementations, each of the sensors 222A-$i$, 222B-$i$, 222C-$i$, 222D-$i$ may be provided on a substrate (e.g., a circuit board) and/or in association with a stabilization module having one or more springs or other systems for compensating for motion of the camera system 210-$i$ or the sensors 222A-$i$, 222B-$i$, 222C-$i$, 222D-$i$, or any vibration affecting the sensors 222A-$i$, 222B-$i$, 222C-$i$, 222D-$i$.

The camera modules 220A-$i$, 220B-$i$, 220C-$i$, 220D-$i$ may capture imaging data in the form of one or more still or moving images (e.g., streams of visual and/or depth image frames), along with any relevant audio signals or other information (e.g., position data). The camera system 210-$i$ and/or the camera modules 220A-i, 220B-i, 220C-i, 220D-i may further include any number of illuminators (not shown), or systems such as laser systems or a light-emitting diodes (or "LED") for illuminating portions of environments or scenes appearing within fields of view of the camera system 210-i, e.g., by infrared or near-infrared light, such as light with wavelengths ranging from approximately seven hundred to approximately one thousand nanometers (700-1000 nm), as necessary.

The processors 224-i may be configured to process imaging data captured by one or more of the sensors 222A-i, 222B-i, 222C-i, 222D-i. For example, in some implementations, the processors 224-i may be configured to execute any type or form of machine learning tools or technique, e.g., an artificial neural network.

The transceivers 226-i enable the camera system 210-i to communicate with the data processing system 270 or any other external devices, systems or components by way of the network 290. In some implementations, the camera system 210-i may be configured to communicate through one or more wired or wireless means, e.g., wired technologies such as Universal Serial Bus (or "USB") or fiber optic cable, or standard wireless protocols such as Bluetooth® or any Wireless Fidelity (or "Wi-Fi") protocol, either by way of the servers 272 or over the network 290 directly.

The camera systems 210-1, 210-2 . . . 210-n of FIG. 2A may be deployed in any number, and may be homogenous or heterogeneous in nature, in accordance with the present disclosure. For example, one or more of the camera systems 210-1, 210-2 . . . 210-n may include camera modules 220A-i, 220B-i, 220C-i, 220D-i having both visual (e.g., color, grayscale or black-and-white) and depth sensors 222A-i, 222B-i, 222C-i, 222D-i. Alternatively, one or more of the camera systems 210-1, 210-2 . . . 210-n may include camera modules 220A-i, 220B-i, 220C-i, 220D-i having just a visual sensor 222A-i, 222B-i, 222C-i, 222D-i, or just a depth sensor 222A-i, 222B-i, 222C-i, 222D-i. For example, one or more of the camera systems 210-1, 210-2 . . . 210-n may include an RGB color camera, a still camera, a motion capture/video camera or any other type or form of camera. In other implementations, one or more of the camera systems 210-1, 210-2 . . . 210-n may include depth-sensing cameras, such as an RGBD or RGBz camera. In still other implementations, one or more of the camera systems 210-1, 210-2 . . . 210-n may include a thermographic or infrared (IR) camera. Additionally, in some implementations, one or more of the camera systems 210-1, 210-2 . . . 210-n may simply be camera modules that include a lens and an image sensor configured to convert an optical image obtained using the lens of the camera into a digital signal or digital representation of the image (generally referred to herein as imaging data).

The camera systems 210-1, 210-2 . . . 210-n may also include manual or automatic features for modifying their respective fields of view or orientations. For example, one or more of the camera modules 220A-i, 220B-i, 220C-i, 220D-i of a camera system 210-i may include one or more motorized features for adjusting positions of the camera modules 220A-i, 220B-i, 220C-i, 220D-i, or for adjusting either a focal length or an angular orientation of the camera modules 220A-i, 220B-i, 220C-i, 220D-i, by causing changes in the distance between the sensor and the lens (e.g., optical zoom lenses or digital zoom lenses), or changes in one or more of the angles defining the angular orientation.

Some of the camera systems 210-1, 210-2 . . . 210-n may digitally or electronically adjust images captured from fields of view of the respective camera modules 220A-i, 220B-i, 220C-i, 220D-i, subject to one or more physical and operational constraints. For example, a digital camera may virtually stretch or condense the pixels of an image in order to focus or broaden a field of view of the digital camera, and also translate one or more portions of images within the field of view. Imaging devices having optically adjustable focal lengths or axes of orientation are commonly referred to as pan-tilt-zoom (or "PTZ") imaging devices, while imaging devices having digitally or electronically adjustable zooming or translating features are commonly referred to as electronic PTZ (or "ePTZ") imaging devices.

Additionally, the processors 224-i or other components of the camera systems 210-1, 210-2 . . . 210-n may be configured to recognize characteristics of stationary or moving objects or portions thereof depicted in one or more digital images, and to match such characteristics against information regarding contours, outlines, colors, textures, silhouettes, shapes or other characteristics of known objects, which may be stored in one or more data stores. In this regard, stationary or moving objects may be classified based at least in part on the extent to which the characteristics identified in one or more digital images correspond to one or more of the characteristics of the known objects. For example, in some implementations, the processors 224-i may be programmed to execute one or more machine learning algorithms, tools or techniques.

In some implementations, components of the camera system 210 may be self-powered, e.g., by one or more internal or onboard power sources, such as batteries or fuel cells. In some other implementations, however, components of the camera system 210 may receive power of any type or form from one or more external power sources, e.g., by one or more conductors or other connectors. Accordingly, the camera system 210 may include any number of transformers, converters (e.g., step-down converters), capacitors, resistors, inductors, transistors or other components for utilizing or altering power received from such external power sources. Furthermore, in some implementations, the camera system 210 may be configured to receive power via one or more connections or conductors that may also be provided for one or more other purposes, such as according to a PoE standard or system that may also be utilized to receive information or data from one or more external devices or systems, or to transfer information or data to one or more external devices or systems, e.g., over the network 290.

Although the system 200 of FIG. 2A includes boxes corresponding to three camera systems 210-1, 210-2 . . . 210-n, those of ordinary skill in the pertinent arts will recognize that any number or type of camera systems may be operated in accordance with the present disclosure. For example, in some implementations, the system 200 may include dozens or even hundreds of camera systems 210-1, 210-2 . . . 210-n of any type or form, which may be mounted in regular or irregular configurations over or in association with a materials handling facility or other environment or scene in any manner.

The data processing system 270 includes one or more physical computer servers 272 having one or more computer processors 274 and any number of data stores 276 (e.g., databases) associated therewith, as well as provided for any specific or general purpose. For example, the data processing system 270 of FIGS. 2A and 2B may be independently provided for the exclusive purpose of receiving, analyzing or storing imaging data or other information or data received from the camera systems 210-1, 210-2 . . . 210-n or, alternatively, provided in connection with one or more physical or virtual services that are configured to receive, analyze or store such imaging data or other information or data, as well as to perform one or more other functions. In some implementations, the data processing system 270 may be associated with a materials handling facility, or any other physical or virtual facility.

The servers 272 may be connected to or otherwise communicate with the processors 274 and the data stores 276, which may store any type of information or data, including but not limited to acoustic signals, information or data relating to imaging data, or information or data regarding environmental conditions, operational characteristics, or positions, for any purpose. The servers 272, the processors 274 and/or the data stores 276 may also connect to or otherwise communicate with the network 290, through the sending and receiving of digital data. For example, the data processing system 270 may include any facilities, stations or locations having the ability or capacity to receive and store information or data, such as media files, in one or more data stores, e.g., media files received from the camera systems 210-1, 210-2 . . . 210-*n*, or from one or more other external computer systems (not shown) via the network 290. In some implementations, the data processing system 270 may be provided in a physical location. In other such implementations, the data processing system 270 may be provided in one or more alternate or virtual locations, e.g., in a "cloud"-based environment. In still other implementations, the data processing system 270 may be provided onboard one or more vehicles, e.g., an unmanned aerial vehicle.

The network 290 may be any wired network, wireless network, or combination thereof, and may comprise the Internet in whole or in part. In addition, the network 290 may be a personal area network, local area network, wide area network, cable network, satellite network, cellular telephone network, or combination thereof. The network 290 may also be a publicly accessible network of linked networks, possibly operated by various distinct parties, such as the Internet. In some implementations, the network 290 may be a private or semi-private network, such as a corporate or university intranet. The network 290 may include one or more wireless networks, such as a Global System for Mobile Communications (GSM) network, a Code Division Multiple Access (CDMA) network, a Long-Term Evolution (LTE) network, or some other type of wireless network. Protocols and components for communicating via the Internet or any of the other aforementioned types of communication networks are well known to those skilled in the art of computer communications and thus, need not be described in more detail herein.

The computers, servers, devices and the like described herein have the necessary electronics, software, memory, storage, databases, firmware, logic/state machines, microprocessors, communication links, displays or other visual or audio user interfaces, printing devices, and any other input/output interfaces to provide any of the functions or services described herein and/or achieve the results described herein. Also, those of ordinary skill in the pertinent art will recognize that users of such computers, servers, devices and the like may operate a keyboard, keypad, mouse, stylus, touch screen, or other device (not shown) or method to interact with the computers, servers, devices and the like, or to "select" an item, link, node, hub or any other aspect of the present disclosure.

The camera systems 210-1, 210-2 . . . 210-*n* and/or the data processing system 270 may use any web-enabled or Internet applications or features, or any other client-server applications, features or other messaging techniques, to connect to the network 290, or to communicate with one another. For example, the camera systems 210-1, 210-2 . . . 210-*n* may be adapted to transmit information or data in the form of synchronous or asynchronous messages to the data processing system 270 or to any other computer device in real time or in near-real time, or in one or more offline processes, via the network 290. Those of ordinary skill in the pertinent art would recognize that the camera systems 210-1, 210-2 . . . 210-*n* or the data processing system 270 may operate or be operated by any of a number of computing devices that are capable of communicating over the network, including but not limited to set-top boxes, smart speakers, personal digital assistants, digital media players, web pads, laptop computers, desktop computers, electronic book readers, and the like. The protocols and components for providing communication between such devices are well known to those skilled in the art of computer communications and need not be described in more detail herein.

The data and/or computer-executable instructions, programs, firmware, software and the like (also referred to herein as "computer-executable" components) described herein may be stored on a computer-readable medium that is within or accessible by computers or computer components such as the processors 224-*i* or the processor 274, or any other computers or control systems utilized by the camera systems 210-1, 210-2 . . . 210-*n* or the data processing system 270, and having sequences of instructions which, when executed by a processor (e.g., a central processing unit, or "CPU"), cause the processor to perform all or a portion of the functions, services and/or methods described herein. Such computer-executable instructions, programs, software, and the like may be loaded into the memory of one or more computers using a drive mechanism associated with the computer readable medium, such as a floppy drive, CD-ROM drive, DVD-ROM drive, network interface, or the like, or via external connections.

Some implementations of the systems and methods of the present disclosure may also be provided as a computer-executable program product including a non-transitory machine-readable storage medium having stored thereon instructions (in compressed or uncompressed form) that may be used to program a computer (or other electronic device) to perform processes or methods described herein. The machine-readable storage media of the present disclosure may include, but is not limited to, hard drives, floppy diskettes, optical disks, CD-ROMs, DVDs, ROMs, RAMs, erasable programmable ROMs ("EPROM"), electrically erasable programmable ROMs ("EEPROM"), flash memory, magnetic or optical cards, solid-state memory devices, or other types of media/machine-readable medium that may be suitable for storing electronic instructions. Further, implementations may also be provided as a computer-executable program product that includes a transitory machine-readable signal (in compressed or uncompressed form). Examples of machine-readable signals, whether modulated using a carrier or not, may include, but are not limited to, signals that a computer system or machine hosting or running a computer program can be configured to access, or including signals that may be downloaded through the Internet or other networks.

As used herein, the term "materials handling facility" may include, but is not limited to, warehouses, distribution centers, cross-docking facilities, order fulfillment facilities, packaging facilities, shipping facilities, rental facilities, libraries, retail stores or establishments, wholesale stores, museums, or other facilities or combinations of facilities for performing one or more functions of material or inventory handling for any purpose.

Figure 3:
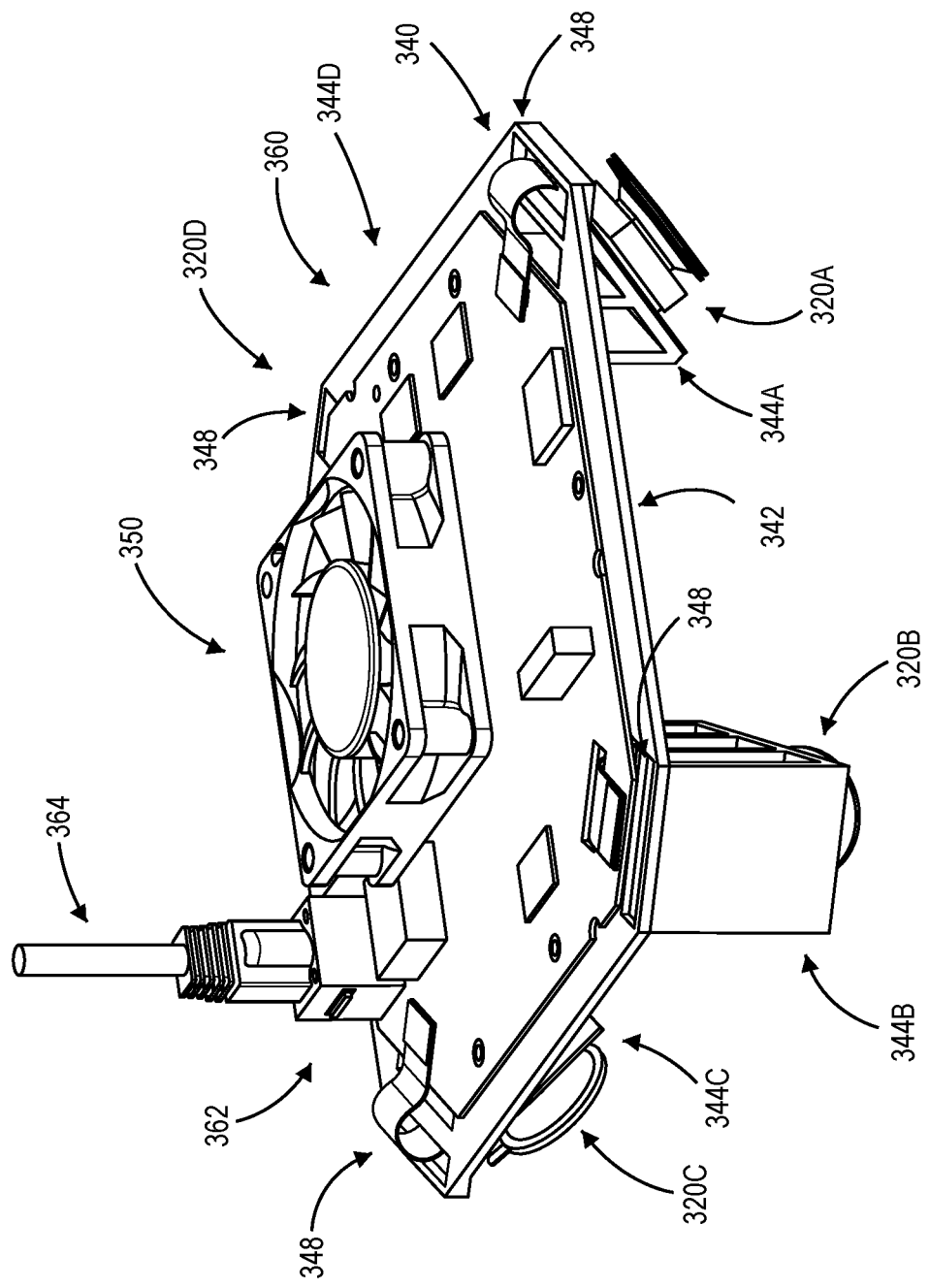
FIG. 3 is a view of aspects of one camera system in accordance with implementations of the present disclosure.

The camera systems of the present disclosure may include camera modules that are provided in housings and joined to circuit boards, optical benches or other components, and configured for mounting to ceilings or other structures that are positioned above areas of interest, such as above one or more areas of a retail establishment or another materials handling facility. Referring to FIG. 3, a view of aspects of one camera system in accordance with implementations of the present disclosure is shown. Except where otherwise noted, reference numerals preceded by the number "3" shown in FIG. 3 indicate components or features that are similar to components or features having reference numerals preceded by the number "2" shown in FIGS. 2A and 2B or by the number "1" shown in FIGS. 1A through 1D.

FIG. 3 is a perspective view of an assembly including a plurality of camera modules 320A, 320B, 320C, 320D, as well as a bench 340 (e.g., an optical bench) joined to a circuit board 360. The bench 340 includes a platform 342 or a substantially planar section. The platform 342 may include a plurality of fins, pins or other extensions below the bench 340, thereby forming a heat sink beneath the platform 342. The bench 340 may be formed from any suitable materials, such as an aluminum, e.g., an aluminum alloy such as aluminum-6063 or ADC12, and by any process. For example, the bench 340, the platform 342 and any fins, pins or other extensions may be formed by die casting or extrusion. Alternatively, in some implementations, one or more aspects of the bench 340 may be formed from any other materials, including not only metals but also plastics or composites, and by any other processes.

As is shown in FIG. 3, each of the camera modules 320A, 320B, 320C, 320D is evenly distributed about a yaw axis or centroid defined by the bench 340 or the circuit board 360, such that the respective camera modules 320A, 320B, 320C, 320D are separated by ninety degrees from one another about the yaw axis or centroid. As is further shown in FIG. 3, the camera module 320A and the camera module 320C are aligned directly opposite one another, and the camera module 320B and the camera module 320D are aligned directly opposite one another. Alternatively, or additionally, the camera modules 320A, 320B, 320C, 320D need not be evenly distributed about the yaw axis or centroid, and may instead be unevenly distributed about the yaw axis or centroid, such that one pair of the camera modules 320A, 320B, 320C, 320D is separated by greater than ninety degrees about the yaw axis or centroid, and another pair of the camera modules is separated by less than ninety degrees about the yaw axis or centroid. Furthermore, in some implementations, the bench 340 and the circuit board 360 may include any number of camera modules, e.g., a number greater than or less than four, and such camera modules may be evenly or unevenly distributed about a yaw axis or centroid defined by the bench 340 or the circuit board 360. The systems and methods disclosed herein are not limited to camera systems, benches or circuit boards having only four camera modules.

Each of the camera modules 320A, 320B, 320C, 320D may include any number of camera sensors, lenses, substrates or stabilization modules, or other components for enabling the capture of imaging data, as well as any number of connectors or other features. Camera sensors of the camera modules 320A, 320B, 320C, 320D may include one or more arrays of photodetectors or photosensitive components such as CCD sensors, CMOS sensors, photodiodes, or other sensors that are provided within a housing and configured to capture light reflected from objects and assign one or more quantitative values (e.g., red, green, blue or other color values, or distances or ranges) to aspects of the reflected light. The camera sensors may be configured to capture any imaging data, such as visual imaging data or depth imaging data at any levels of resolution or frame rates.

Stabilization modules of the camera modules 320A, 320B, 320C, 320D may include housings or other components having one or more internal springs or other systems for compensating for any motion of the camera sensors, or any vibration affecting the camera sensors. Alternatively, in some implementations, the camera modules 320A, 320B, 320C, 320D need not include a stabilization module or the respective components thereof.

Additionally, substrates of the camera modules 320A, 320B, 320C, 320D may be or include boards or other like systems for mounting or framing the camera sensors with respect to the lenses. In some implementations, the substrates may include one or more bores or other openings for coupling the camera modules 320A, 320B, 320C, 320D to the bench 340 or other systems by one or more fasteners. Additionally, the camera modules 320A, 320B, 320C, 320D may further include connectors or other components for electrically coupling the camera modules 320A, 320B, 320C, 320D to power sources, processors, or other components. Such connectors may be formed from single pieces of conductive material (e.g., aluminum or copper, or others), that are suitably durable and foldable or bendable for connecting with one or more components of a camera system, e.g., the circuit board 360 or any other systems.

The bench 340 further includes a plurality of extensions 344A, 344B, 344C, 344D below the platform 342, with each of the extensions 344A, 344B, 344C, 344D having an angled section or panel to or against which a corresponding one of the camera modules 320A, 320B, 320C, 320D is mounted or aligned. The extensions 344A, 344C include sections or panels that are angled or sloped with respect to a plane defined by the platform 342 (e.g., in a non-parallel fashion) such that the camera modules 320A, 320C have axes of orientation and fields of view that extend vertically downward below the platform 342 and radially away from a yaw axis or a centroid of a camera system in which the assembly is provided, such that fields of view of the camera modules 320A, 320C do not overlap. The extensions 344B, 344D include sections or panels that are angled or sloped with respect to the plane defined by the platform 342 (e.g., in a non-parallel fashion) such that the camera modules 320B, 320D have axes of orientation and fields of view that extend vertically downward below the platform 342 and radially toward a yaw axis or a centroid of a camera system in which the assembly is provided, such that fields of view of the camera modules 320A, 320C overlap beneath the bench 340.

The bench 340 is coupled to the circuit board 360 by way of any number of fasteners, e.g., bolts, screws, rivets or other components. The bench 340 has a substantially square shape or cross-section with tapered corners, with respect to a yaw axis or a vertical axis, or a substantially octagonal shape or cross-section having opposing pairs of long sides and short sides. Alternatively, the bench 340 or the circuit board 360 may have any other shape or define any other cross-section, e.g., shapes of any other polygons or comic sections such as circles or ellipses, and may be installed or mounted within a housing having a cavity with the same internal shape or cross-section, or a different internal shape or cross-section.

The camera modules 320A, 320B, 320C, 320D are physically mounted or joined to edges at the tapered corners of the bench 340, e.g., by clips or other fasteners, to upper sides or surfaces of the planar sections. Axes of orientation of the camera modules 320A, 320B, 320C, 320D extend normal to and away from the sections or panels of the extensions 344A, 344B, 344C, 344D.

The circuit boards 360 may have any number of components, such as processors or memory or storage components, provided thereon. In some implementations, the circuit boards 360 and the camera modules 320A, 320B, 320C, 320D and/or the bench 340 may be electronically coupled to one another by one or more board-to-board connectors, such that the operation of the camera modules 320A, 320B, 320C, 320D may be powered, controlled or implemented by one or more processors coupled to the circuit board 360. As is shown in FIG. 3, each of the camera modules 320A, 320B, 320C, 320D may be connected to one or more components (e.g., processors) of the circuit board 360 by one or more flexible connectors, and may receive power from or transfer information or data to the circuit board 360 via such connectors. As is also shown in FIG. 3, one or both of the circuit boards 360 may include an Ethernet connector 362 for receiving power or data via an Ethernet cable 364, or, alternatively, one or more power sources, e.g., batteries, transformers, converters or other systems provided thereon.

Additionally, as is shown in FIG. 3, a fan 350 is mounted to the circuit board 360. The fan 350 may be an axial fan, a blower, or any other type of system for initiating flows of fluid therethrough, e.g., by the rotation of blades. The fan 350 may include an inlet that is aligned to draw flows of air into an impeller and radially outward from the impeller, to initiate flows of air through a housing in which the bench 340 and the circuit board 360 are provided, and an outlet aligned to discharge the flows of air across the plurality of fins of the heat sink 365, or ultimately to an outlet of a housing of the camera system 310 (not shown). The platform 342 may further include any number of openings (or channels) 348 provided adjacent to or near the tapered corners of the bench 340, such that air flow passing through such openings 348 passes over the circuit board 360 and within the vicinity of the camera modules 320, thereby enabling heat generated by components of the circuit board 360 or the camera modules 320A, 320B, 320C, 320D to be transferred away, e.g., by convective heat transfer.

Figure 4B:
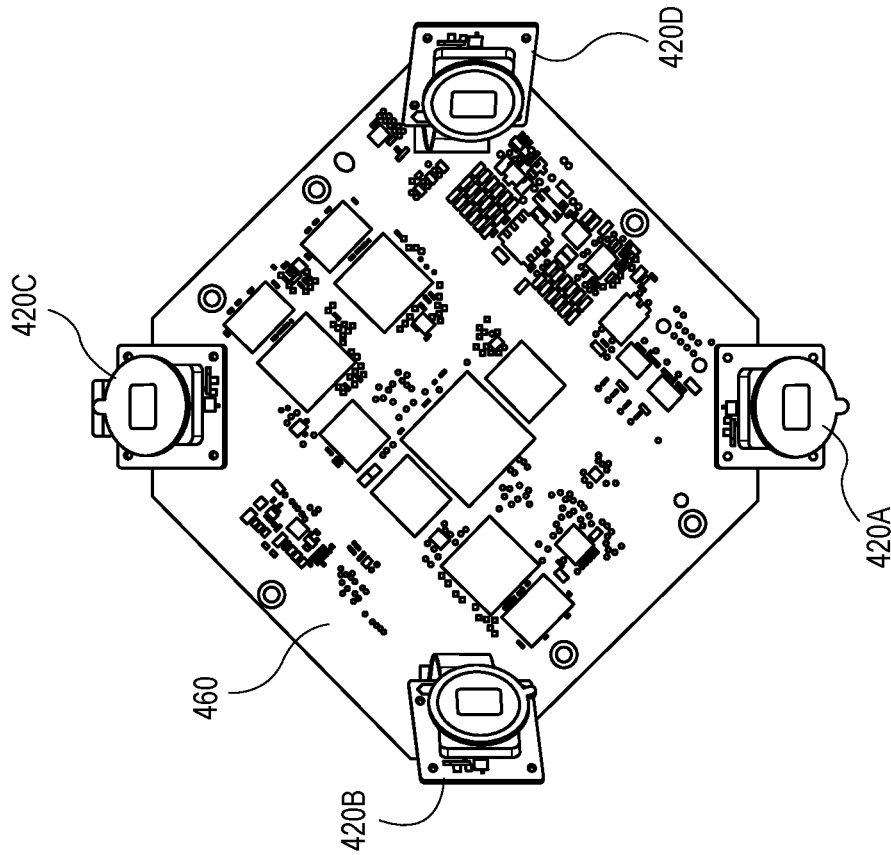
FIGS. 4A and 4B are views of aspects of one camera system in accordance with implementations of the present disclosure.
Figure 4A:
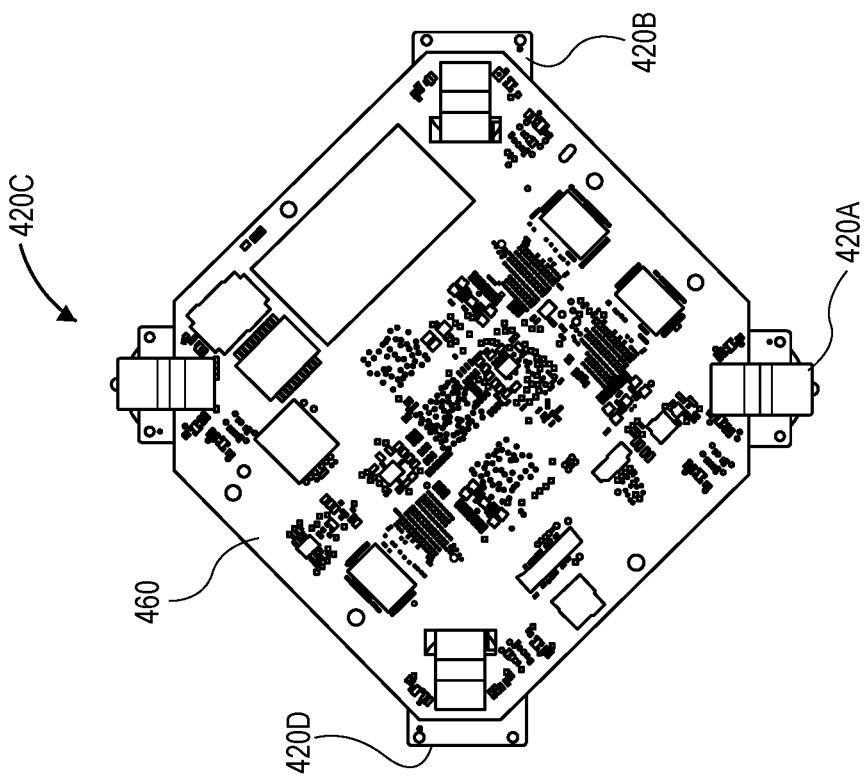

As is also discussed above, the camera systems of the present disclosure may include one or more circuit boards (e.g., printed circuit board assemblies) having any number of processors, power sources or other components coupled thereto. The circuit boards may be installed within a housing or other structure of a camera system in a manner that defines one or more channels or openings of a flow path within the housing. Referring to FIGS. 4A and 4B, views of aspects of one camera system in accordance with implementations of the present disclosure are shown. Except where otherwise noted, reference numerals preceded by the number "4" shown in FIG. 4A or FIG. 4B indicate components or features that are similar to components or features having reference numerals preceded by the number "3" shown in FIG. 3, by the number "2" shown in FIGS. 2A and 2B or by the number "1" shown in FIGS. 1A through 1D.

As is shown in FIGS. 4A and 4B, a circuit board 460 has a substantially square shape or cross-section with tapered corners, or a substantially octagonal shape or cross-section having opposing pairs of long sides and short sides. FIG. 4A shows a top view of the circuit board 460. FIG. 4B shows a bottom view of the circuit board 460. Alternatively, circuit boards of the present disclosure may have any shapes other than squares or octagons, such as other polygons or circles.

The circuit board 460 may include any number of components coupled thereto, including but not limited to capacitors, diodes, inductors, integrated circuits, processors, rectifiers, resistors, sensors, transformers, transistors, or other systems coupled to a substrate and connected via any number of traces. As is further shown in FIGS. 4A and 4B, a plurality of camera modules 420A, 420B, 420C, 420D are coupled to the circuit board 460, e.g., at the tapered corners of the circuit board 460, or on short sides of the circuit board 460. The circuit board 460 may share one or more attributes or features in common with the circuit board 360 of FIG. 3, and may be configured for mounting to a bench, such as an optical bench, and installed within a housing of a camera system in accordance with implementations of the present disclosure.

The circuit board 460 may have any dimensions, such as lengths and widths of approximately one hundred ninety millimeters (mm), and thicknesses of approximately one to two millimeters (mm). Alternatively, the circuit board 460 may have any other dimensions.

Figure 5B:
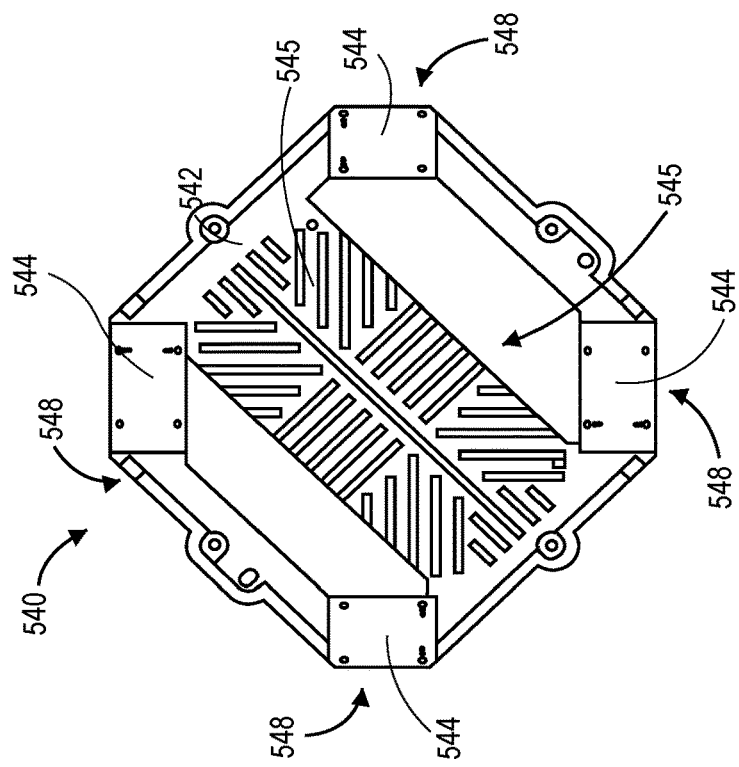
FIGS. 5A and 5B are views of aspects of one camera system in accordance with implementations of the present disclosure.
Figure 5A:
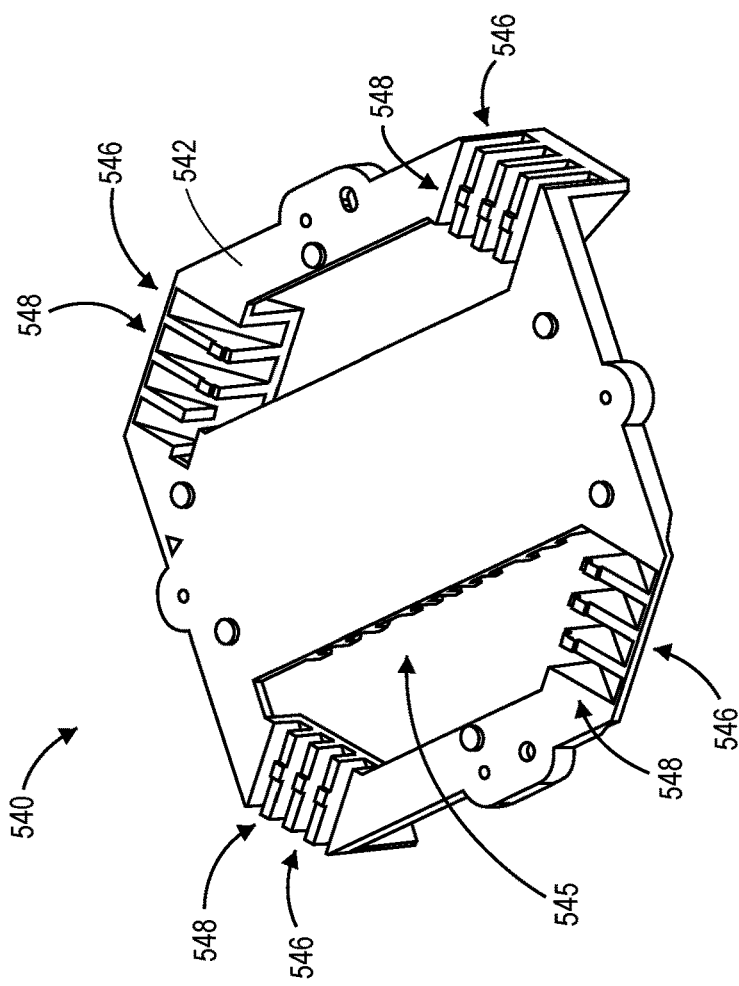

Referring to FIGS. 5A and 5B, views of aspects of one camera system in accordance with implementations of the present disclosure are shown. Except where otherwise noted, reference numerals preceded by the number "5" shown in FIG. 5A or FIG. 5B indicate components or features that are similar to components or features having reference numerals preceded by the number "4" shown in FIG. 4A or FIG. 4B, by the number "3" shown in FIG. 3, by the number "2" shown in FIGS. 2A and 2B or by the number "1" shown in FIGS. 1A through 1D.

As is shown in FIGS. 5A and 5B, a bench 540 (e.g., an optical bench) includes a platform 542 having a substantially square shape or cross-section with tapered corners, or a substantially octagonal shape or cross-section having opposing pairs of long sides and short sides. FIG. 5A shows a top perspective view of the bench 540. FIG. 5B shows a bottom view of the bench 540. Alternatively, benches of the present disclosure may have any shapes other than squares or octagons, such as other polygons or circles.

As is shown in FIGS. 5A and 5B, the bench 540 includes a heat sink 545 and a plurality of sets of channels (or openings) 548 in the platform 542, e.g., at or near the tapered corners of the platform 542. An upper surface (or top surface) of the platform 542 is configured for mounting a circuit board, such as the circuit board 460 of FIGS. 4A and 4B, thereto by one or more fasteners, e.g., bolts, screws, rivets or other components, which may be used to mount a circuit board thereto via one or more openings provided in a perimeter of the platform 542.

As is further shown in FIGS. 5A and 5B, the heat sink 545 spans from one side of the substantially square shape of the platform 542 to another side of the platform 542, or between opposing long sides of the platform 542. Additionally, the platform 542 further includes a pair of gaps or other openings between sides of the platform 542 and the heat sink 545. Such gaps or openings may be covered or closed when a circuit board is mounted to the upper surface of the platform 542. Alternatively, in some implementations, the platform 542 may be substantially solid, and need not include any of the gaps or openings shown in FIGS. 5A and 5B.

Additionally, as is also shown in FIGS. 5A and 5B, the bench 540 further includes a plurality of extensions 544 extending from a lower surface of the platform 542, or from short sides of the platform 542, with each of the extensions 544 having an angled section or panel to or against which a camera module may be mounted or aligned. The sections or panels of the extensions 544 may be angled or sloped with respect to a plane defined by the platform 542 such that camera modules mounted or aligned adjacent to such sections or panels have axes of orientation and fields of view that extend normal from such sections or panels and vertically downward below the lower surface of the platform 542.

Additionally, as is further shown in FIGS. 5A and 5B, the sets of channels 548 are defined by sets of fins or walls and the sections or panels of the extensions 544, such that air flow from a space above the platform 542 passes through the sets of channels 548 and is directed to a space below the platform 542 by the fins or walls and the plurality of extensions 544. Thus, air flow passing from the space above the platform 542 through the sets of channels 548 provides convective cooling to the plurality of extensions 544, on opposite sides of sections or panels having the camera modules mounted or aligned adjacent thereto, before passing into the space below the platform 542.

As is also shown in FIG. 5A, the lower surface of the heat sink 545 further includes a plurality of fins 546 extending normal therefrom, e.g., in a central region of the platform 542, with each of the fins 546 having a substantially common height. The fins 546 extend into a space below the heat sink 545 and enhance the transfer of heat therefrom in the presence of air flow entering into the space below the platform 542 by way of the channels 548. Additionally, the fins 546 also extend normal from the lower surface of the platform 542 in sets. Some of the fins 546 are aligned parallel to the channels 548, such that air flow directed into the space below the platform 542 is further directed toward a center of the heat sink 545. The fins 546 beneath the heat sink 545 enhance the transfer of heat from any camera modules or other components of a circuit board mounted to the top surface of the platform 542, or from any other components of a camera system, in the presence of air flow entering into the space below the platform 542 by way of the channels 548. Alternatively, the fins 546 beneath the heat sink 545 may be oriented or aligned in any direction, and additional fins may be provided about a perimeter of the platform 542, or in any other portion of the platform 542.

Portions of the bench 540, viz., the platform 542, the heat sink 545, the fins 546, the channels 548 or others, may be formed from any suitable materials, such as an aluminum, e.g., an aluminum alloy such as aluminum-6063 or ADC12, and by any process. For example, the bench 540, the platform 542 and any fins, pins or other extensions may be formed in a single-piece manner, by die casting, extrusion, or any other processes. Alternatively, in some implementations, one or more aspects of the bench 540 may be formed from any other materials, including not only metals but also plastics or composites, and may be formed by any processes.

Figure 6B:
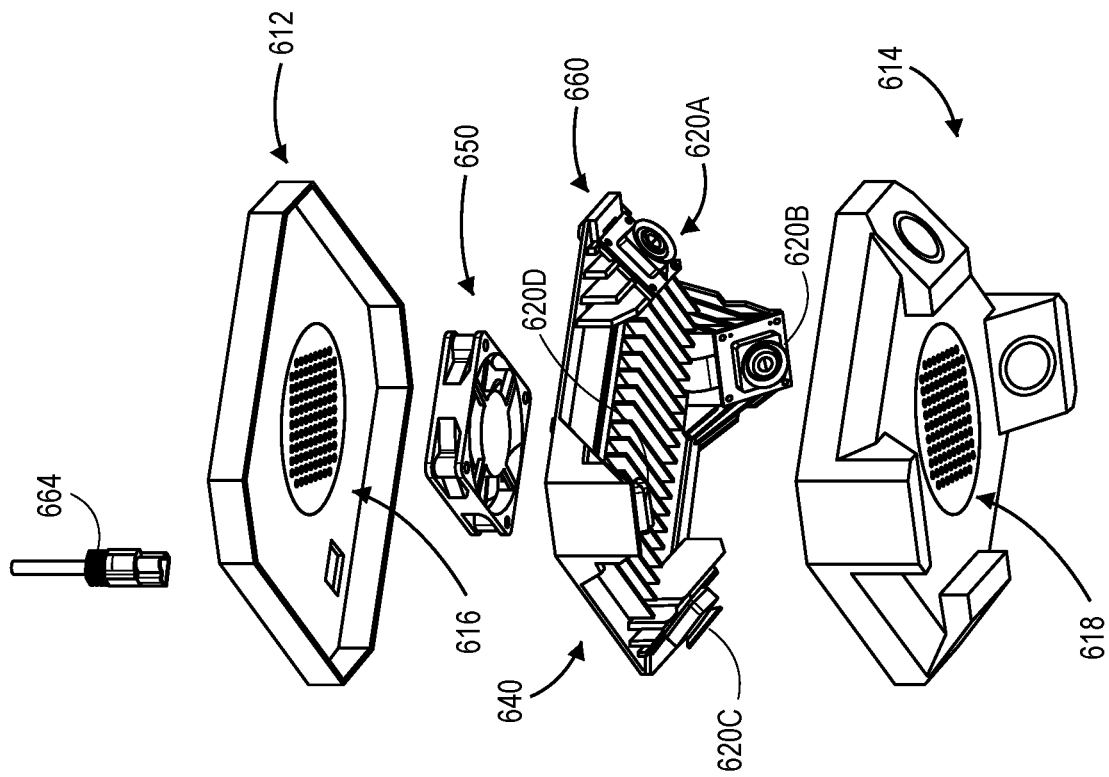
FIGS. 6A and 6B are views of aspects of one camera system in accordance with implementations of the present disclosure.
Figure 6A:
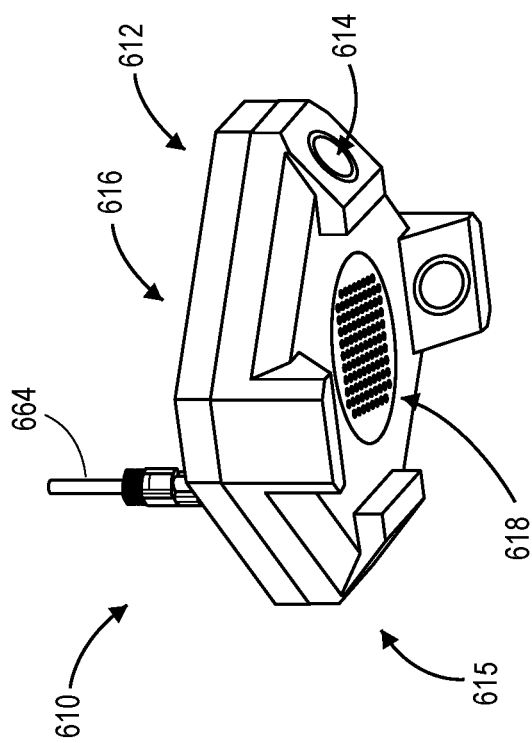

Referring to FIGS. 6A and 6B, views of aspects of one camera system in accordance with implementations of the present disclosure are shown. Except where otherwise noted, reference numerals preceded by the number "6" shown in FIG. 6A or FIG. 6B indicate components or features that are similar to components or features having reference numerals preceded by the number "5" shown in FIG. 5A or FIG. 5B, by the number "4" shown in FIG. 4A or FIG. 4B, by the number "3" shown in FIG. 3, by the number "2" shown in FIGS. 2A and 2B or by the number "1" shown in FIGS. 1A through 1D.

FIG. 6A shows an assembled view of a camera system 610. FIG. 6B shows an exploded view of the camera system 610.

As is shown in FIGS. 6A and 6B, the camera system 610 includes a housing 615 formed from an upper frame 612 and a lower frame 614. The camera system 610 further includes a plurality of camera modules 620A, 620B, 620C, 620D, a bench 640 (e.g., an optical bench), a fan 650 (e.g., an axial fan, or blower), and a circuit board 660 disposed within the housing 615. The camera modules 620A, 620C are aligned with axes of orientation and fields of view that extend vertically downward and radially away from a yaw axis or a centroid of the camera system 610, while the camera modules 620B, 620D are aligned with axes of orientation and fields of view that extend vertically downward and radially toward the yaw axis or the centroid of the camera system 610. Additionally, as is further shown in FIGS. 6A and 6B, the camera system 610 may be configured to receive power or data via an Ethernet cable 664, e.g., according to a PoE standard or system.

The upper frame 612 includes an air flow inlet 616, which is provided on a top surface or panel of the upper frame 612 and aligned to receive air vertically from above the camera system 610 into the housing 615, and the lower frame 614 includes an air flow outlet 618, which is provided on an underside of the lower frame 614, and is aligned to expel flows of air in a substantially vertical direction below the housing 615, thereby discharging heat from within the camera system 610 to ambient. The upper frame 612 and the lower frame 614 may be formed in any manner, such as by injection molding, and from any suitable materials such as polycarbonates or combinations of polycarbonates and other materials, e.g., ABS. Alternatively, in some other implementations, the upper frame 612 or the lower frame 614 may be formed from any materials other than plastics or composites, such as woods or metals, and combined into a single-piece construction, or coupled or joined by one or more hinges.

The camera system 610 may be assembled in any manner and according to any procedure. For example, in some implementations, the fan 650 may be mounted to the upper frame 612 or the circuit board 660 using any number of screws (e.g., M5 screws or threaded bolts) or other fasteners, along with any supporting materials such as tapes or films (e.g., polyimide films) or foam pads, and wires for powering the fan 650 may be connected to the circuit board 660 in any manner. Next, the circuit board 660 may be joined to the bench 640, such as by applying one or more gaskets or layers of putty to an upper surface of the bench 640, placing the circuit board 660 adjacent to the upper surface of the bench 640, and securing the circuit board 660 to the bench 640 using any number of screws (e.g., M5 screws or threaded bolts) or other fasteners.

The camera modules 620A, 620B, 620C, 620D may then be installed onto the bench 640, e.g., by connecting board-to-board connectors between each of the camera modules 620A, 620B, 620C, 620D and one or more components of the circuit board 660, and fastening the camera modules 620A, 620B, 620C, 620D to the circuit board 660 using any number of screws (e.g., M2×0.4 screws or threaded bolts) or other fasteners. An assembly including the bench 640 with the camera modules 620A, 620B, 620C, 620D mounted thereon and the circuit board 660 joined thereto is then installed into the lower frame 614 using any number of screws (e.g., M2.5 screws or threaded bolts) or other fasteners. The upper frame 612 is then installed over the lower frame 614 with the assembly therein and secured in place using any number of screws (e.g., M2.5×0.4 screws or threaded bolts) or other fasteners, and the assembly of the camera system 610 is complete. Alternatively, the upper frame 612 may be joined to the lower frame 614 using any type or form of snap-fit or other connections.

Once the camera system 610 has been assembled by joining the upper frame 612 and the lower frame 614 together with the bench 640, the camera modules 620A, 620B, 620C, 620D and the circuit board 660 provided therein, the camera system 610 may be installed in place above an environment or scene, and the Ethernet cable 664 may be connected thereto. Imaging data captured from the scene using the camera modules 620A, 620B, 620C, 620D may then be utilized for any purpose.

As is discussed above, camera systems of the present disclosure feature architectures that define flow paths extending from inlets to housings of the camera systems through the housings and adjacent to camera modules, processors, or other heat-generating components of the camera systems, and from the housings via outlets. Air flow along such flow paths may be initiated by fans (e.g., axial fans) or blowers disposed within such housings, and may transfer heat from components within the housings to ambient environments outside of such housings. Referring to FIGS. 7A through 7D, views of aspects of one camera system in accordance with implementations of the present disclosure are shown. Except where otherwise noted, reference numerals preceded by the number "7" shown in FIGS. 7A through 7D indicate components or features that are similar to components or features having reference numerals preceded by the number "6" shown in FIG. 6A or FIG. 6B, by the number "5" shown in FIG. 5A or FIG. 5B, by the number "4" shown in FIG. 4A or FIG. 4B, by the number "3" shown in FIG. 3, by the number "2" shown in FIGS. 2A and 2B or by the number "1" shown in FIGS. 1A through 1D.

Figure 7D:
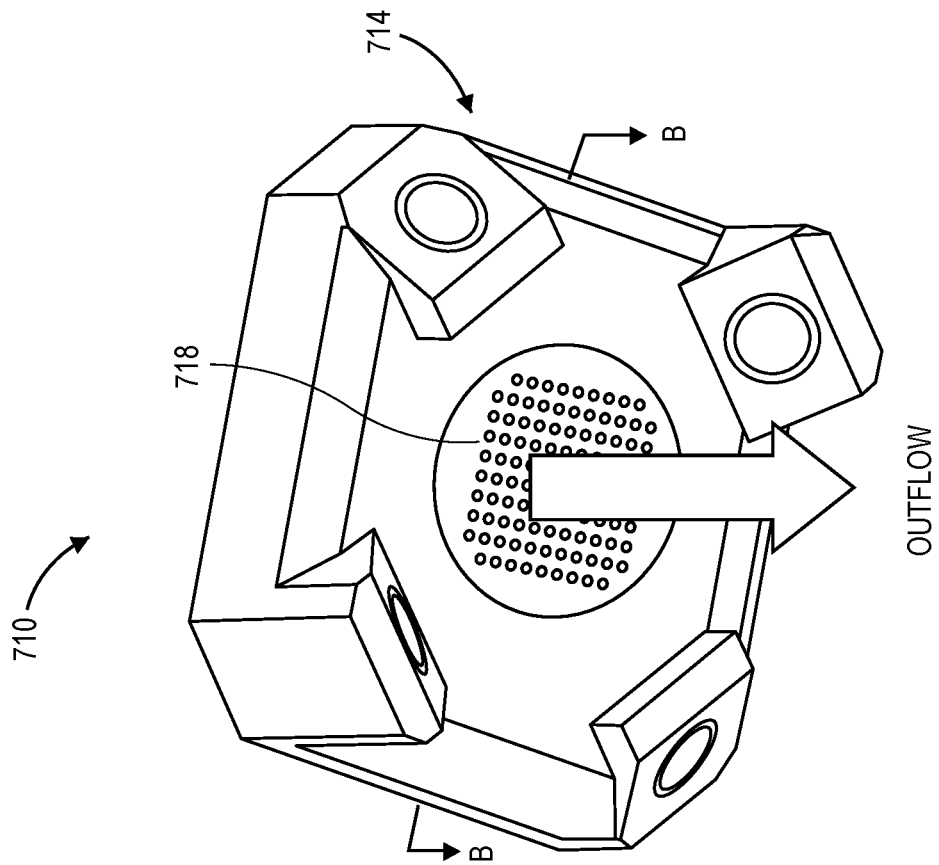
Figure 7C:
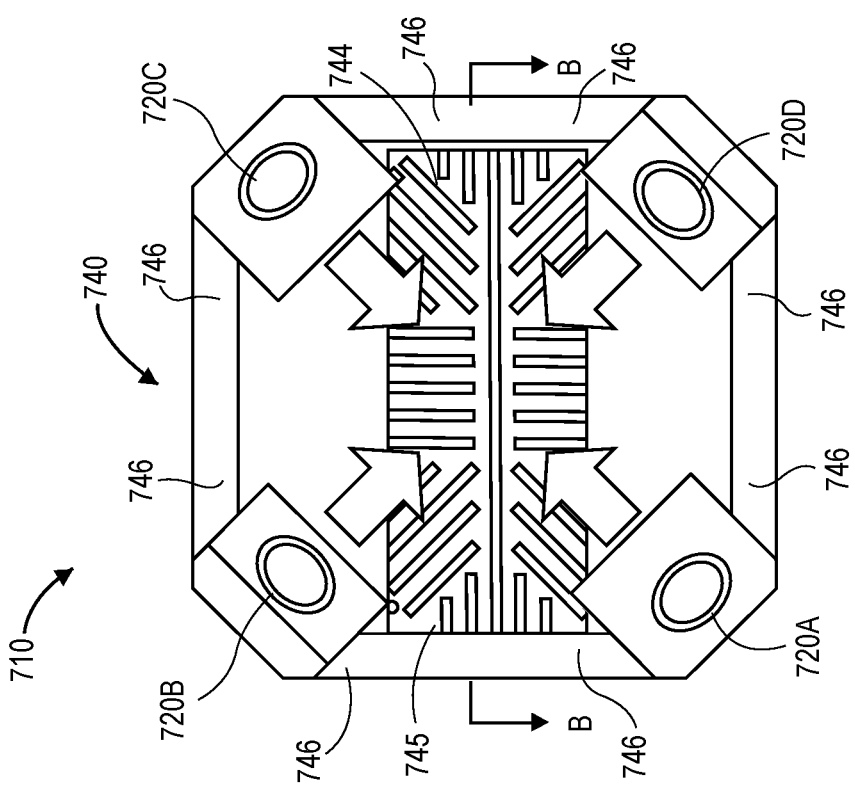

FIG. 7A is a top perspective view of a camera system 710. FIG. 7B is a top sectional view of the camera system 710 along the section line A-A shown in FIG. 7A. FIG. 7C is a bottom sectional view of the camera system 710 along a section line B-B shown in FIG. 7D, which is a bottom perspective view of the camera system 710.

As is shown in FIG. 7A, the camera system 710 includes an upper frame (or cover assembly) 712 and a lower frame (or cover assembly) 714 defining a housing 715, and a plurality of camera modules 720A, 720B, 720C, 720D disposed within the housing 715. The camera system 710 further includes an Ethernet connector 762 provided at an upper surface of the upper frame 715 for receiving power or data via an Ethernet cable 764, connected thereto, as well as an inlet 716 provided in the upper surface of the upper frame 715. The inlet 716 may include or feature a grated or perforated opening into the housing 715 through which an inflow of air may pass.

As is shown in FIG. 7B, the camera system 710 includes a fan 750 (e.g., an axial fan) mounted to a circuit board 760 joined to a bench 740 (e.g., an optical bench) provided within the housing 715. During operation, the fan 750 initiates the inflow of air from outside of the housing 715, e.g., via the inlet 716 shown in FIG. 7A, into a space above the circuit board 760, and distributes the air radially outward from the fan 750 toward a plurality of openings 748 provided in the bench 740 beneath the circuit board 760. The housing 715 defines a substantially square shape or cross-section with tapered corners, or a substantially octagonal shape or cross-section having opposing pairs of long sides and short sides. The openings 748 are provided within the bench 748 near the tapered corners of the housing 715, and extend between the space above the circuit board 760 within the housing 715 to a space below the bench 740 within the housing 715.

As is shown in FIG. 7C, after the air passes through the openings 748 at the tapered corners of the housing and into the space below the bench 740, the air is distributed within or between ducts defined by sets of fins 746 provided adjacent to extensions or other features for mounting or supporting the camera modules 720A, 720B, 720C, 720D within the housing 715, or along or over such fins 746. The air then passes within or between ducts defined by another set of fins 745 provided within a vicinity of a centroid of the housing 715, or along or over such fins 745. The sets of fins 745, 746 enhance the capacity of the camera system 710 to transfer heat generated by components of the circuit board 760 or the camera modules 720A, 720B, 720C, 720D out of the housing 715, e.g., by convection.

As is shown in FIG. 7D, the flow of air initiated by the fan 750 departs from the housing 715 via an outlet 718 provided in the lower frame 714 of the housing 715. The outlet 718 may include or feature a grated or perforated exit from the housing 715 through which an outflow of the air may pass. When the camera system 710 is operating, air departing the housing 715 shown in FIG. 7D is warmer in temperature than air entering the housing 715 as shown in FIG. 7A, e.g., due to convective heat transfer within the housing 715.

As is discussed above, camera systems of the present disclosure may have any shapes or sizes, and may include any number of camera modules aligned to capture imaging data in multiple directions and around entire perimeters of the camera systems.

Figure 8B:
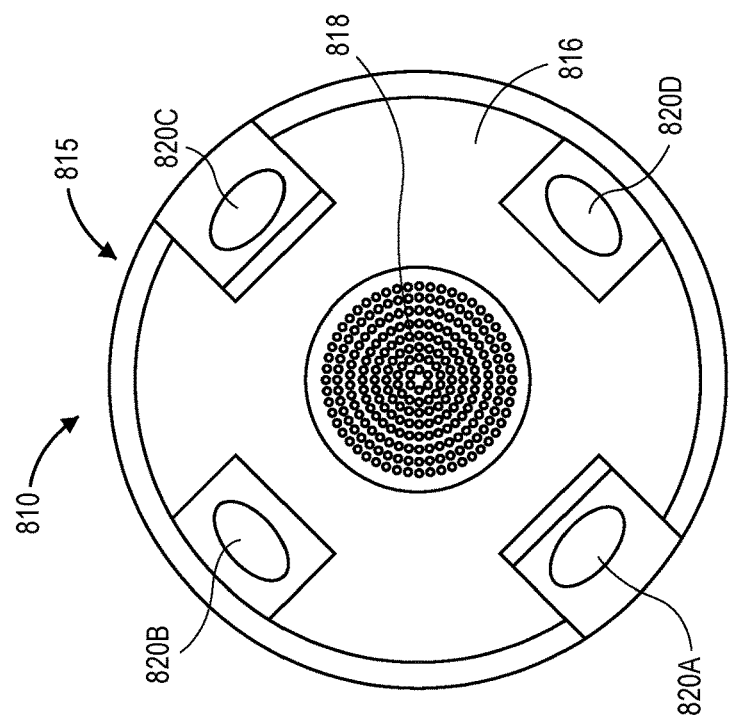
FIGS. 8A and 8B are views of aspects of one system including a camera system in accordance with implementations of the present disclosure.
Figure 8A:
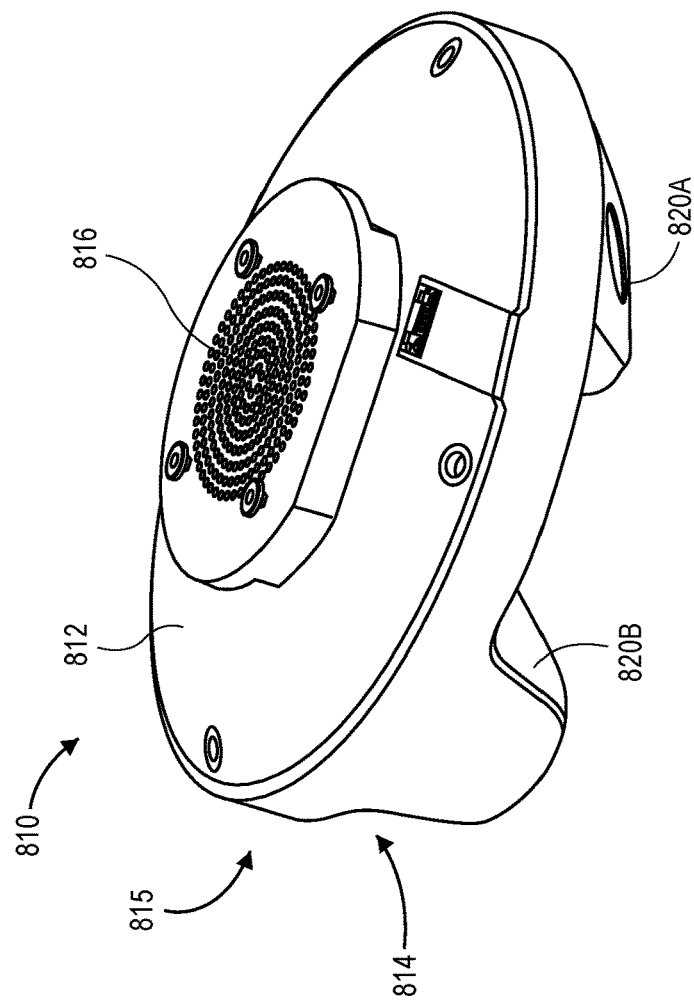

Referring to FIGS. 8A and 8B, views of aspects of one camera system in accordance with implementations of the present disclosure are shown. Except where otherwise noted, reference numerals preceded by the number "8" shown in FIG. 8A or 8B indicate components or features that are similar to components or features having reference numerals preceded by the number "7" shown in FIGS. 7A through 7D, by the number "6" shown in FIG. 6A or FIG. 6B, by the number "5" shown in FIG. 5A or FIG. 5B, by the number "4" shown in FIG. 4A or FIG. 4B, by the number "3" shown in FIG. 3, by the number "2" shown in FIGS. 2A and 2B or by the number "1" shown in FIGS. 1A through 1D.

As is shown in FIGS. 8A and 8B, a camera system 810 includes two pairs of camera modules 820A, 820B, 820C, 820D that are provided within a housing 815 or other structure formed from one or more parts, e.g., an upper frame (or cover assembly) 812 and a lower frame (or cover assembly) 814, and have fields of view that extend normal from angled surfaces provided at least in part below the camera system 810. Each of the camera modules 820A, 820B, 820C, 820D may be configured to capture color images, grayscale images, black-and-white images, or any other type or form of imaging data (e.g., depth images). The camera system 810 may be configured for mounting to a ceiling or another elevated surface or fixture within a materials handling facility, or any other facility located in any environment or scene.

FIG. 8A shows a top perspective view of the camera system 810. FIG. 8B shows a bottom view of the camera system 810. As is shown in FIGS. 8A and 8B, each of the camera modules 820A, 820B, 820C, 820D is evenly distributed about a yaw axis or centroid of the housing 815, such that the respective camera modules 820A, 820B, 820C, 820D are separated by ninety degrees from one another about the yaw axis or centroid. As is further shown in FIG. 8B, the camera module 820A and the camera module 820C are aligned directly opposite one another, and the camera module 820B and the camera module 820D are aligned directly opposite one another. Alternatively, or additionally, the camera modules 820A, 820B, 820C, 820D need not be evenly distributed about the yaw axis or centroid, and may instead be unevenly distributed about the yaw axis or centroid. Although FIG. 8B shows only the four camera modules 820A, 820B, 820C, 820D, camera systems of the present disclosure may include or feature any number of camera modules, e.g., greater than or less than four of such modules.

As is shown in FIGS. 8A and 8B, the upper frame 812 of the housing 815 includes an air flow inlet 816, and the lower frame 814 of the housing 815 includes an air flow outlet 818. The upper frame 812 may be configured for mounting the camera system 810 to one or more surfaces, either directly or to one or more other components extending therefrom, that are provided above or in association with a retail establishment or another materials handling facility.

The upper frame 812 and the lower frame 814 may be formed in any manner, such as by injection molding, and from any suitable materials. For example, in some implementations, the upper frame 812 or the lower frame 814 may be formed from polycarbonates or combinations of polycarbonates and other materials, such as ABS, or from any materials other than plastics or composites.

As is further shown in FIGS. 8A and 8B, the housing 815 has a shape of a disc or a cylinder, and defines a substantially circular cross-section about a yaw axis or centroid of the camera system 810. The housing 815 may define a cavity for accommodating a bench, a circuit board or the camera modules 820A, 820B, 820C, 820D, which have axes of orientation or fields of view extending from surfaces or panels that descend below a perimeter of the upper frame 812 and are provided at slopes or angles with respect to an underside of the housing 815, or with respect to a cross-section of the housing 815. The camera modules 820A, 820C, are "outward facing," or face away from each other, and away from a yaw axis or a centroid of the camera system 810. The camera modules 820B, 820D are "inward facing," or face toward one another, and toward a yaw axis or a centroid of the camera system 810.

In some implementations, the housing 815 may have a diameter of approximately one hundred ninety millimeters (mm). In some implementations, the housing 815 may have a height of approximately seventy millimeters (mm).

The camera modules 820A, 820B, 820C, 820D may be utilized and configured to capture images in any environment, such as in a materials handling facility, as actors execute one or more interactions with shelving units or other systems, e.g., by removing items from such shelving units or other systems, or placing items onto such shelving units or other systems, or taking any other actions. The camera modules 820A, 820B, 820C, 820D may have any level of resolution, as well as axes of orientation or fields of view that extend downward at any angles. The camera system 810 may be in communication with any number of external devices or systems, e.g., by one or more network connections (not shown), and may be powered in any manner. e.g., by internal or onboard power sources, such as batteries or fuel cells, or by external power sources, such as by a PoE standard or system that may also be utilized to transfer information or data to or from the camera system 810. Images captured by the camera modules 820A, 820B, 820C, 820D may be utilized for any purpose.

As is discussed above, camera systems of the present disclosure include camera modules aligned in directions or orientations that enable the camera systems to capture imaging data from various environments or spaces, e.g., within materials handling facilities. Imaging data captured by the camera systems may be utilized for any purpose.

Figure 9A:
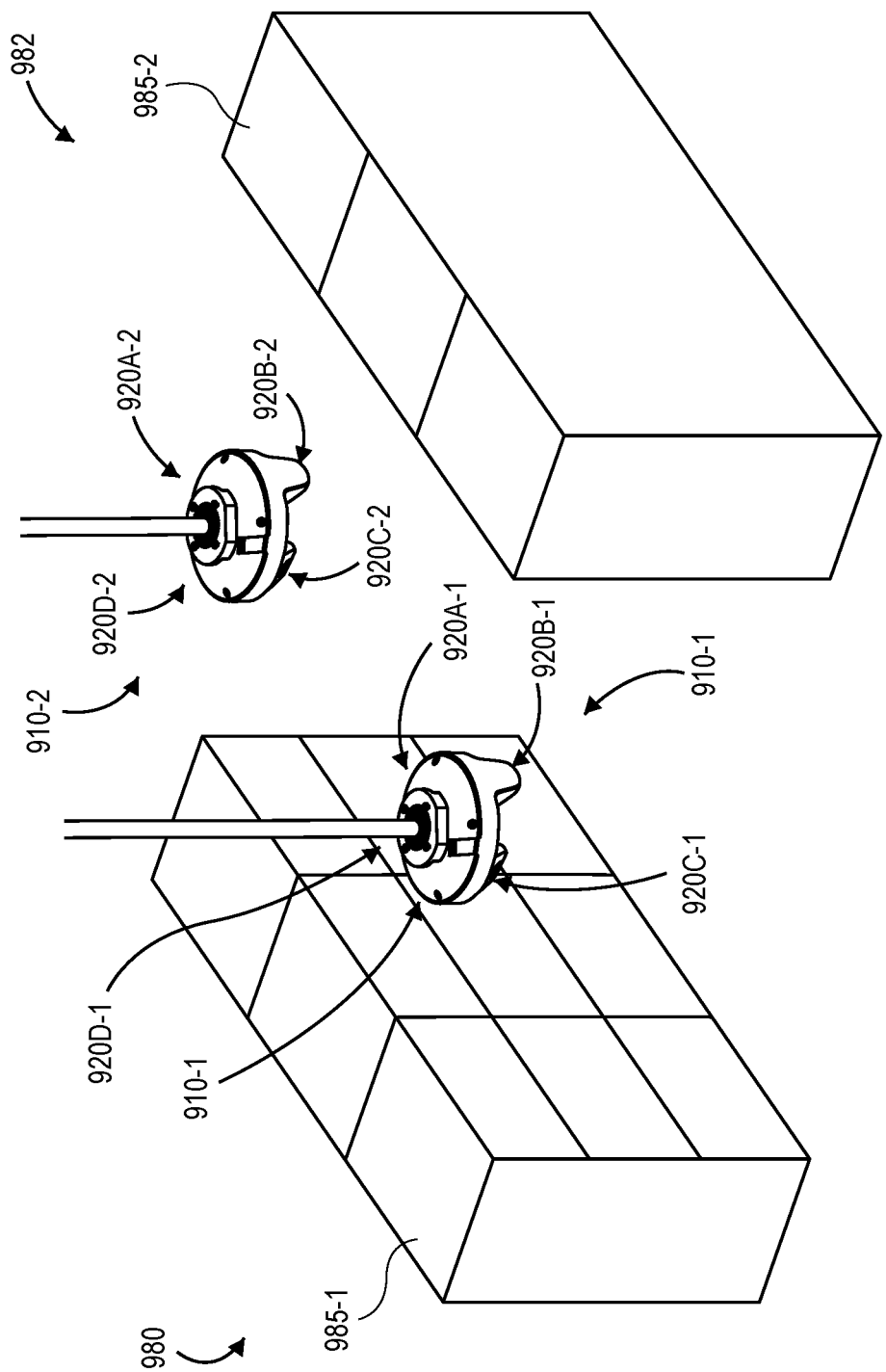
FIGS. 9A and 9B are views of aspects of one system including a camera system in accordance with implementations of the present disclosure.
Figure 9B:
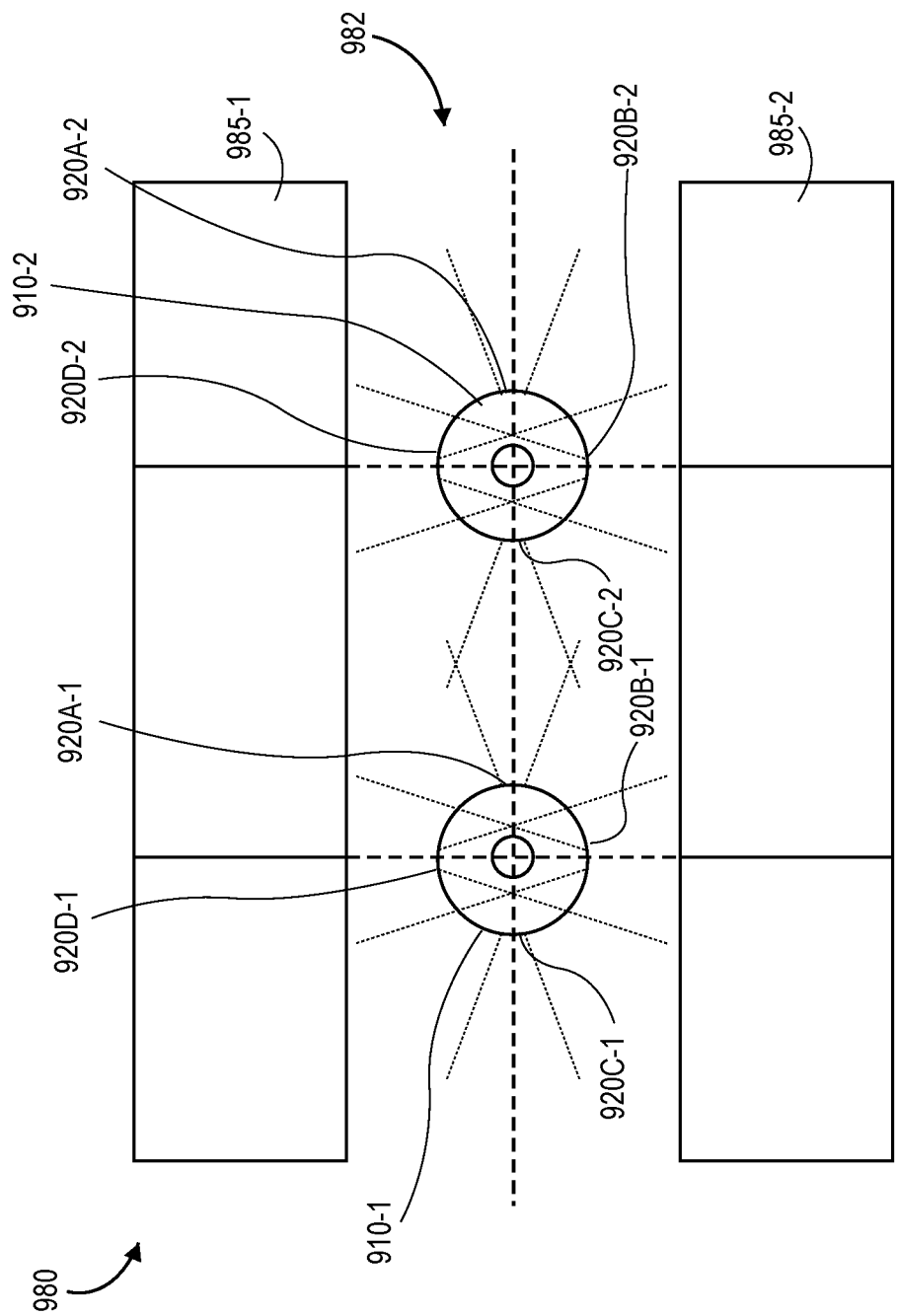

Referring to FIGS. 9A and 9B, views of aspects of one camera system in accordance with implementations of the present disclosure are shown. Except where otherwise noted, reference numerals preceded by the number "9" shown in FIG. 9A or 9B indicate components or features that are similar to components or features having reference numerals preceded by the number "8" shown in FIG. 8A or 8B, by the number "7" shown in FIGS. 7A through 7D, by the number "6" shown in FIG. 6A or FIG. 6B, by the number "5" shown in FIG. 5A or FIG. 5B, by the number "4" shown in FIG. 4A or FIG. 4B, by the number "3" shown in FIG. 3, by the number "2" shown in FIGS. 2A and 2B or by the number "1" shown in FIGS. 1A through 1D.

As is shown in FIGS. 9A and 9B, a pair of camera systems 910-1, 910-2 are mounted to a ceiling or another elevated surface or fixture within a materials handling facility 980 including a plurality of shelving units 985-1, 985-2 or other systems for accommodating items, or for enabling customers, associates or other personnel to retrieve items therefrom or deposit items thereon. The shelving units 985-1, 985-2 are aligned parallel to one another, and the camera systems 910-1, 910-2 are mounted above a passageway 982 or another traveling space provided between the shelving units 985-1, 985-2.

The shelving units 985-1, 985-2 may be structures or fixtures including one or more shelves that rest on or are provided in association with floor space at the materials handling facility 980. Alternatively, or additionally, the materials handling facility 980 may include one or more tables or other substantially planar surfaces or systems for accommodating one or more items thereon, as well as any number of carts or other fixed or mobile accessory systems associated with the shelving units 985-1, 985-2 or items thereon. In some implementations, the materials handling facility 980 may include any number of fixed or mobile systems of any sizes or shapes for accommodating items, and any number of camera systems may be mounted above, on, to or near any of such other systems, in any locations or configurations.

Each of the camera systems 910-1, 910-2 includes four camera modules mounted or disposed therein and aligned or oriented in accordance with one or more implementations of the present disclosure. The camera module 910-1 includes four camera modules 920A-1, 920B-1, 920C-1, 920D-1 provided within a housing or other structure formed from one or more parts, e.g., an upper frame and a lower frame. Likewise, the camera module 910-2 includes four camera modules 920A-2, 920B-2, 920C-2, 920D-2 provided within a housing or other structure formed from one or more parts.

As is shown in FIG. 9B, the camera system 910-1 includes camera modules 920A-1, 920C-1 having axes of orientation or fields of view that extend below the camera system 910-1 and are aligned parallel to the passageway 982. The camera modules 920A-1, 920C-1 are configured to capture imaging data regarding personnel or items provided within the passageway 982. Similarly, the camera system 910-2 includes camera modules 920A-2, 920C-2 having axes of orientation or fields of view that extend below the camera system 910-2 and are aligned parallel to the passageway 982. The camera modules 920A-2, 920C-2 are configured to capture imaging data regarding personnel or items provided within the passageway 982. As is further shown in FIG. 9B, although the field of view of the camera module 920A-1 of the camera system 910-1 and the field of view of the camera module 920C-2 of the camera system 910-1 overlap with one another, the fields of view of the camera module 920A-1 and the camera module 920C-1 do not overlap with one another, and the fields of view of the camera module 920A-2 and the camera module 920C-2 do not overlap with one another.

As is further shown in FIG. 9B, the camera module 920D-1 of the camera system 910-1 and the camera module 920D-2 of the camera system 910-2 have axes of orientation or fields of view that extend below the respective camera systems 910-1, 910-2 and toward the shelving unit 985-1. The camera modules 920D-1, 920D-2 are configured to capture imaging data regarding interactions with items on the shelving unit 985-1 by personnel within the passageway 982. As is also shown in FIG. 9B, the camera module 920B-1 of the camera system 910-1 and the camera module 920B-2 of the camera system 910-2 have axes of orientation or fields of view that extend below the respective camera systems 910-1, 910-2 and toward the shelving unit 985-2. The camera modules 920B-1, 920B-2 are configured to capture imaging data regarding interactions with items on the shelving unit 985-2 by personnel within the passageway 982.

In some implementations, the camera systems 910-1, 910-2 are mounted approximately six feet from one another above the passageway 982, and approximately three feet from the respective shelving units 985-1, 985-2. Locations and orientations of the camera systems 910-2, 910-2 within the materials handling facility 980 may be selected to provide adequate coverage of interactions with items on the respective shelving units 985-1, 985-2, or any other actions by personnel within the materials handling facility 980.

Although some of the implementations disclosed herein reference the use of the camera systems of the present disclosure in materials handling facilities or like environments, those of ordinary skill in the pertinent arts will recognize that the systems and methods disclosed herein are not so limited, and may be utilized in connection with cameras that are provided for any intended industrial, commercial, recreational or other use.

It should be understood that, unless otherwise explicitly or implicitly indicated herein, any of the features, characteristics, alternatives or modifications described regarding a particular implementation herein may also be applied, used, or incorporated with any other implementation described herein, and that the drawings and detailed description of the present disclosure are intended to cover all modifications, equivalents and alternatives to the various implementations as defined by the appended claims. Moreover, with respect to the one or more methods or processes of the present disclosure described herein, orders in which such methods or processes are presented are not intended to be construed as any limitation on the claimed inventions, and any number of the method or process steps described herein can be combined in any order and/or in parallel to implement the methods or processes described herein. For example, although some of the drawings depict processes for assembling a camera system by coupling components to one portion of a housing (e.g., a frame) and mating that portion of the housing with another portion of the housing (e.g., another frame), those of ordinary skill in the pertinent arts will recognize that the camera systems disclosed herein may be assembled in any manner. Also, the drawings herein are not drawn to scale.

Conditional language, such as, among others, "can," "could," "might," or "may," unless specifically stated otherwise, or otherwise understood within the context as used, is generally intended to convey in a permissive manner that certain implementations could include, or have the potential to include, but do not mandate or require, certain features, elements and/or steps. In a similar manner, terms such as "include," "including" and "includes" are generally intended to mean "including, but not limited to." Thus, such conditional language is not generally intended to imply that features, elements and/or steps are in any way required for one or more implementations or that one or more implementations necessarily include logic for deciding, with or without user input or prompting, whether these features, elements and/or steps are included or are to be performed in any particular implementation.

Disjunctive language such as the phrase "at least one of X, Y, or Z," or "at least one of X, Y and Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain implementations require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Language of degree used herein, such as the terms "about," "approximately," "generally," "nearly" or "substantially" as used herein, represent a value, amount, or characteristic close to the stated value, amount, or characteristic that still performs a desired function or achieves a desired result. For example, the terms "about," "approximately," "generally," "nearly" or "substantially" may refer to an amount that is within less than 10% of, within less than 5% of, within less than 1% of, within less than 0.1% of, and within less than 0.01% of the stated amount.

Although the invention has been described and illustrated with respect to illustrative implementations thereof, the foregoing and various other additions and omissions may be made therein and thereto without departing from the spirit and scope of the present disclosure.

What is claimed is:

1. A camera system comprising:
    a housing defined by an upper frame and a lower frame;
    an airflow inlet provided in an upper surface of the upper frame, wherein the airflow inlet comprises at least a first opening between an exterior of the housing and a first space within an interior of the housing;
    an airflow outlet provided in a lower surface of the lower frame, wherein the airflow outlet comprises at least a second opening between the exterior of the housing and a second space within the interior of the housing;
    a bench comprising a platform, a plurality of openings in the platform, a plurality of extensions descending below a lower surface of the platform, and a heat sink comprising a plurality of fins, wherein each of the plurality of extensions comprises a panel aligned at an angle with respect to the platform, and wherein each of the fins extends into the second space;
    a first camera module comprising a first image sensor and a first lens, wherein the first camera module is coupled to a first panel of a first extension of the plurality of extensions, wherein the first camera module has a first field of view extending below the housing and away from a yaw axis of the housing;
a second camera module comprising a second image sensor and a second lens, wherein the second camera module is coupled to a second panel of a second extension of the plurality of extensions, wherein the second camera module has a second field of view extending below the housing and away from the yaw axis of the housing;
a third camera module comprising a third image sensor and a third lens, wherein the third camera module is coupled to a third panel of a third extension of the plurality of extensions, wherein the third camera module has a third field of view extending below the housing and toward the yaw axis of the housing;
a fourth camera module comprising a fourth image sensor and a fourth lens, wherein the fourth camera module is coupled to a fourth panel of a fourth extension of the plurality of extensions, wherein the fourth camera module has a fourth field of view extending below the housing and toward the yaw axis of the housing;
a circuit board disposed within the interior of the housing, wherein the circuit board comprises at least one computer processor, and wherein the circuit board is coupled to an upper surface of the platform within the housing; and
a fan disposed within the interior of the housing, wherein the fan is configured to draw air from the exterior of the housing into the interior of the housing by way of the airflow inlet, and wherein the fan is coupled to the circuit board within the housing.

2. The camera system of claim 1, wherein the second camera module is disposed opposite the first camera module, and
wherein the fourth camera module is disposed opposite the third camera module.

3. The camera system of claim 1, wherein the upper frame and the lower frame are joined to define a cavity within the housing,
wherein each of the upper frame and the lower frame is formed from at least one of an acrylonitrile butadiene styrene or a polycarbonate, and
wherein the bench is formed from an aluminum by one of die casting or extrusion.

4. The camera system of claim 1, wherein an internal flow path within the housing extends from the airflow inlet to the airflow outlet via at least:
the first space;
the fan;
at least one of the plurality of openings; and
the second space,
wherein the fan is configured to initiate a flow of air through the housing along the internal flow path.

5. A camera system comprising:
a housing;
a bench disposed within the housing, wherein the bench comprises a platform, a plurality of extensions and a plurality of openings;
a first camera module disposed within the housing, wherein the first camera module is mounted to a first panel of a first extension descending from a lower surface of the platform, wherein a first axis of orientation of the first camera module extends below a plane defined by the platform and outward from a yaw axis of the housing;
a second camera module disposed within the housing, wherein the second camera module is mounted to a second panel of a second extension descending from the lower surface of the platform, and wherein a second axis of orientation of the second camera module extends below the plane defined by the platform and outward from the yaw axis of the housing;
a third camera module disposed within the housing, wherein the third camera module is mounted to a third panel of a third extension descending from the lower surface of the platform, wherein a third axis of orientation of the third camera module extends below the plane defined by the platform and inward toward the yaw axis of the housing; and
a fourth camera module disposed within the housing, wherein the fourth camera module is mounted to a fourth panel of a fourth extension descending from the lower surface of the platform, wherein a fourth axis of orientation of the fourth camera module extends below the plane defined by the platform and inward toward the yaw axis of the housing.

6. The camera system of claim 5, wherein the second camera module is opposite the first camera module with respect to the yaw axis of the housing, and
wherein the fourth camera module is opposite the third camera module with respect to the yaw axis of the housing.

7. The camera system of claim 5, further comprising a circuit board having at least one computer processor,
wherein the circuit board is coupled to an upper surface of the platform, and
wherein each of the first camera module, the second camera module, the third camera module and the fourth camera module is connected to the at least one computer processor.

8. The camera system of claim 7, wherein the housing comprises an upper frame joined to a lower frame to define a cavity,
wherein the circuit board and the bench are disposed within the cavity,
wherein each of the upper frame and the lower frame is formed from at least one of an acrylonitrile butadiene styrene or a polycarbonate, and
wherein the bench is formed from an aluminum by one of die casting or extrusion.

9. The camera system of claim 5, wherein a first angle between the first axis of orientation and the platform is approximately forty degrees.

10. The camera system of claim 5, wherein the housing further comprises a first space and a second space,
wherein the first space is provided above an upper surface of the platform, and
wherein the second space is provided below the lower surface of the platform.

11. The camera system of claim 10, further comprising an inlet provided in an upper surface of the housing and an outlet provided in a lower surface of the housing,
wherein an internal flow path through the housing begins at the inlet and ends at the outlet, and
wherein the internal flow path extends through at least the first space, at least one of the plurality of openings and the second space.

12. The camera system of claim 11, further comprising a fan coupled to the circuit board,
wherein the fan is configured to initiate a flow of air along the internal flow path.

13. The camera system of claim 11, wherein the bench further comprises a heat sink having a plurality of fins, wherein each of the plurality of fins extends into the second space, and wherein the internal flow path extends through at least one duct between at least two of the fins.

14. The camera system of claim 11, wherein the bench further comprises a plurality of channels provided on a first side of the first panel, wherein the first camera module is mounted to a second side of the first panel, wherein each of the plurality of channels passes along the first extension, and wherein the plurality of channels comprises the at least one of the plurality of openings.

15. The camera system of claim 5, wherein the bench has a substantially square shape with tapered corners.

16. The camera system of claim 5, wherein the housing defines a substantially round cross-section.

17. The camera system of claim 5, wherein the camera system is mounted to a structure within a materials handling facility, wherein at least a first portion of a traveling surface within the materials handling facility is within a first field of view of the first camera module, wherein at least a second portion of a traveling surface within the materials handling facility is within a second field of view of the second camera module, wherein at least a first portion of a first shelving unit is within a third field of view of the third camera module, and wherein at least a second portion of a second shelving unit is within a fourth field of view of the fourth camera module.

18. A camera system comprising:

a housing defined by an upper frame and a lower frame forming a cavity, wherein the housing has a substantially circular cross-section;

a bench disposed within the housing, wherein the bench comprises a platform, a plurality of extensions and a plurality of openings;

a circuit board having at least one processor, wherein the circuit board is coupled to an upper surface of the bench within the cavity;

a first camera module disposed within the housing, wherein a first axis of orientation of the first camera module extends below a plane defined by the platform and away from a centroid of the platform;

a second camera module disposed within the housing, wherein a first axis of orientation of the first camera module extends below the plane defined by the platform and away from the centroid of the platform, and wherein the second camera module is disposed opposite the first camera module within the housing;

a third camera module disposed within the housing, wherein a third axis of orientation of the third camera module extends below the plane defined by the platform and toward the centroid of the platform; and a fourth camera module disposed within the housing, wherein a fourth axis of orientation of the fourth camera module extends below the plane defined by the platform and toward the centroid of the platform, and wherein the fourth camera module is disposed opposite the third camera module within the housing.

19. The camera system of claim 18, wherein the upper frame comprises an inlet to an interior of the housing, wherein the lower frame comprises an outlet from the interior of the housing, wherein an internal flow path through the housing begins at the inlet and ends at the outlet, and wherein the internal flow path extends from the inlet through a first space provided above the upper surface of the platform, at least one of the plurality of openings, and a second space provided below the lower surface of the platform to the outlet.

20. The camera system of claim 18, wherein the camera system is mounted to a structure within a materials handling facility, wherein at least a first portion of a traveling surface within the materials handling facility is within a first field of view of the first camera module, wherein at least a second portion of a traveling surface within the materials handling facility is within a second field of view of the second camera module, wherein at least a first portion of a first shelving unit is within a third field of view of the third camera module, and wherein at least a second portion of a second shelving unit is within a fourth field of view of the fourth camera module.

* * * * *